(12) United States Patent
Iiyama et al.

(10) Patent No.: US 8,994,896 B2
(45) Date of Patent: Mar. 31, 2015

(54) SURFACE LIGHT SOURCE AND LIQUID CRYSTAL DISPLAY DEVICE

(71) Applicant: Panasonic Intellectual Property Management Co., Ltd., Osaka (JP)

(72) Inventors: Tomoko Iiyama, Osaka (JP); Daizaburo Matsuki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/728,561

(22) Filed: Dec. 27, 2012

(65) Prior Publication Data

US 2013/0114021 A1    May 9, 2013

Related U.S. Application Data

(63) Continuation of application No. PCT/JP2012/001367, filed on Feb. 29, 2012.

(30) Foreign Application Priority Data

May 31, 2011    (JP) .................................. 2011-121371

(51) Int. Cl.
*G02F 1/1335*    (2006.01)
*G09F 13/04*    (2006.01)
(Continued)

(52) U.S. Cl.
CPC ............ *G09F 13/04* (2013.01); *G02B 19/0009* (2013.01); *G02B 19/0061* (2013.01);
(Continued)

(58) Field of Classification Search
CPC ................... F21Y 2103/003; G02F 1/133603; F21V 5/04

USPC .......................................... 349/61, 62, 64, 65
See application file for complete search history.

(56) References Cited

U.S. PATENT DOCUMENTS

2006/0066218 A1    3/2006    Yamaguchi et al.
2008/0002412 A1    1/2008    Tanaka et al.
(Continued)

FOREIGN PATENT DOCUMENTS

JP         3115370        9/2005
JP         2006-92983     4/2006
(Continued)

OTHER PUBLICATIONS

Notification of Transmittal of Translation of the International Preliminary Report on Patentability issued Dec. 12, 2013 in corresponding International Application No. PCT/JP2012/001367.
(Continued)

*Primary Examiner* — Lucy Chien
(74) *Attorney, Agent, or Firm* — Wenderoth, Lind & Ponack, LLP

(57) ABSTRACT

A light emitting device including a lens in which light radiated from a light source with a wide angle can effectively be oriented while a directional characteristic of the light source is expanded is provided, and a surface light source including the light emitting devices and a liquid crystal display device are provided. The surface light source is configured such that the plural light emitting devices are disposed in a central portion thereof. The light emitting device radiates the light on an optical axis A and around the optical axis A. The light emitting device includes a light source and a lens that radially expands the light from the light source. The lens includes a reflection unit at a bottom surface of the lens partially.

12 Claims, 17 Drawing Sheets

(51) Int. Cl.
  *G02B 19/00* (2006.01)
  *H01L 25/075* (2006.01)
  *H01L 33/58* (2010.01)

(52) U.S. Cl.
  CPC .... *G02F 1/133606* (2013.01); *G02F 1/133603* (2013.01); *G02F 1/133605* (2013.01); *H01L 25/0753* (2013.01); *H01L 33/58* (2013.01); *G02B 2207/113* (2013.01); *G02F 2001/133607* (2013.01); *H01L 2924/0002* (2013.01)
  USPC .................. 349/65; 349/61; 349/62; 349/64

(56) References Cited

U.S. PATENT DOCUMENTS

| | | | |
|---|---|---|---|
| 2008/0303757 A1* | 12/2008 | Ohkawa et al. | 345/82 |
| 2010/0208166 A1 | 8/2010 | Iiyama et al. | |
| 2011/0279751 A1 | 11/2011 | Iiyama et al. | |
| 2012/0069250 A1 | 3/2012 | Kuromizu | |
| 2012/0081619 A1 | 4/2012 | Shimizu | |
| 2012/0086874 A1 | 4/2012 | Yokota | |
| 2012/0176558 A1 | 7/2012 | Nakamura | |

FOREIGN PATENT DOCUMENTS

| | | |
|---|---|---|
| JP | 3875247 | 11/2006 |
| JP | 2008-10693 | 1/2008 |
| JP | 2008-305923 | 12/2008 |
| JP | 2010-108952 | 5/2010 |
| JP | 2011-3460 | 1/2011 |
| JP | 2011-40315 | 2/2011 |
| WO | 2010/140414 | 12/2010 |
| WO | 2010/146903 | 12/2010 |
| WO | 2011/001750 | 1/2011 |
| WO | 2011/007733 | 1/2011 |
| WO | 2011/040427 | 4/2011 |
| WO | 2011/048735 | 4/2011 |

OTHER PUBLICATIONS

Notification of Transmittal of Translation of the International Preliminary Report on Patentability issued Dec. 12, 2013 in corresponding International Application No. PCT/JP2012/001368.
Notification of Transmittal of Translation of the International Preliminary Report on Patentability issued Dec. 12, 2013 in corresponding International Application No. PCT/JP2012/001369.
International Search Report issued May 29, 2012 in International (PCT) Application No. PCT/JP2012/001367.

* cited by examiner

BL INNER THICKNESS 35mm
ONLY LIGHT SOURCE ILLUMINANCE DISTRIBUTION

BL INNER THICKNESS 35mm
NO REFLECTING PART ILLUMINANCE DISTRIBUTION

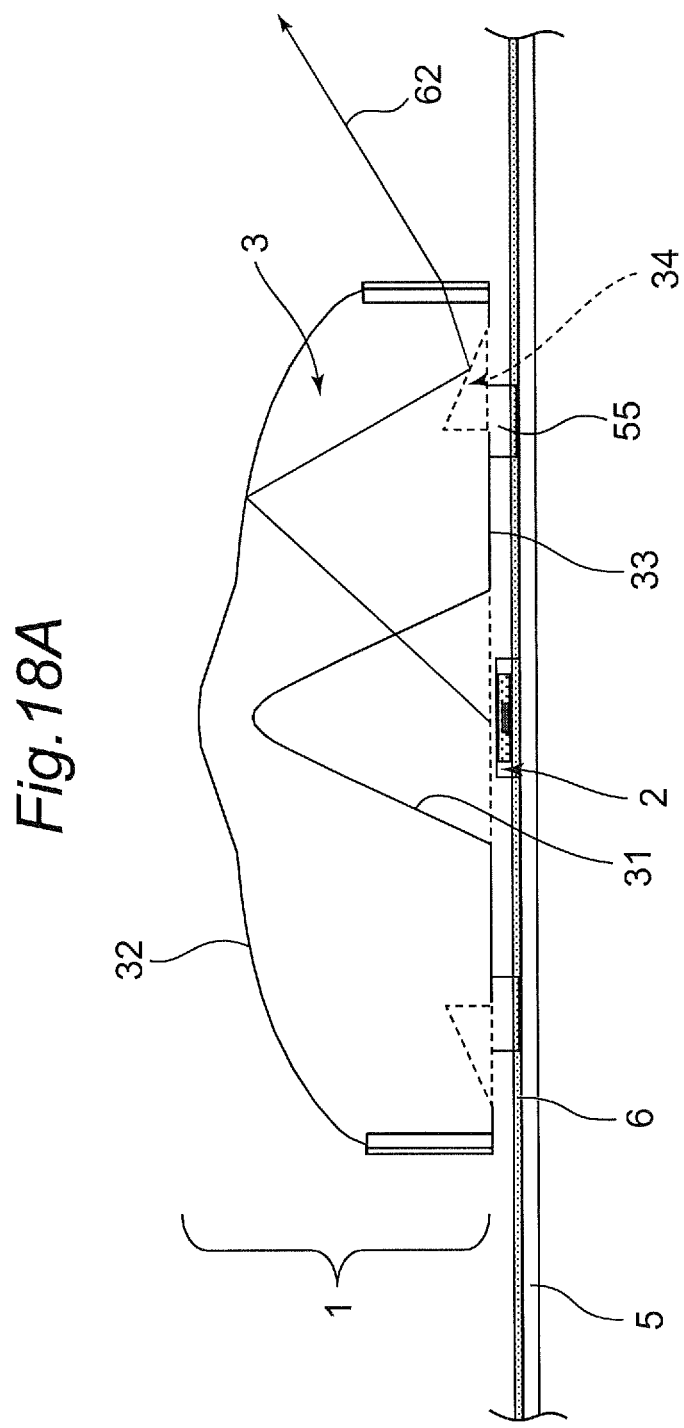

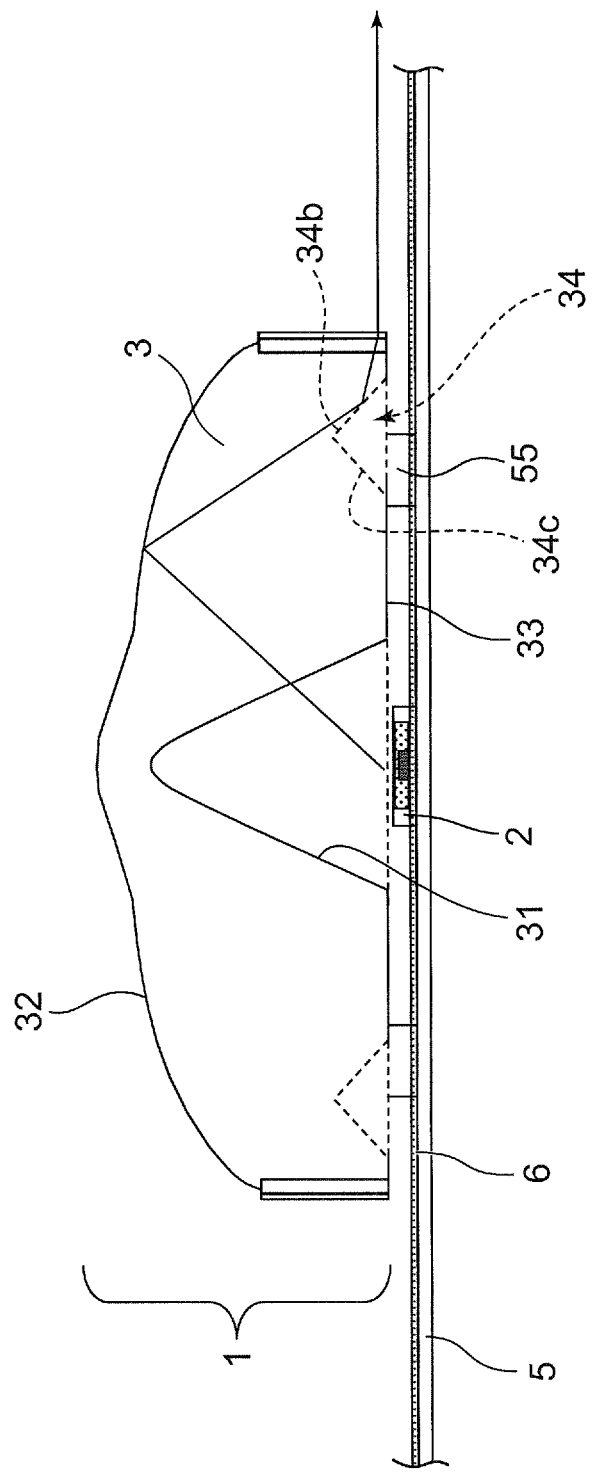

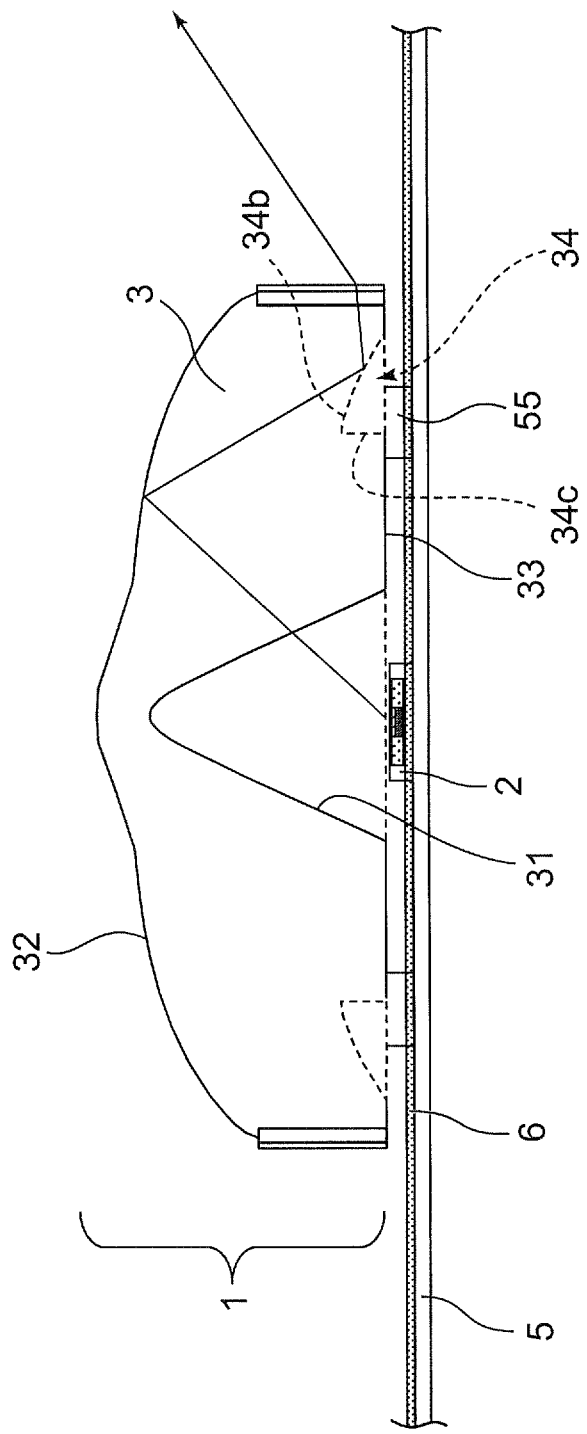

SURFACE LIGHT SOURCE AND LIQUID CRYSTAL DISPLAY DEVICE

CROSS-REFERENCE TO RELATED APPLICATIONS

This is a continuation application of International Application No. PCT/JP2012/001367, with an international filing date of Feb. 29, 2012, which claims priority of Japanese Patent Application No. 2011-121371 filed on May 31, 2011, the content of which is incorporated herein by reference.

BACKGROUND OF THE INVENTION

1. Technical Field

The present disclosure relates to a surface light source having a configuration in which directionality of light emitted from light sources, such as a light emitting diode (hereinafter simply referred to as an "LED"), is expanded by a lens. The disclosure also relates to a liquid crystal display device in which the surface light source is disposed as a backlight at the back of a liquid crystal panel.

2. Description of the Related Art

In a backlight of a conventional large-size liquid crystal display device, many cold-cathode tubes are disposed immediately below the liquid crystal panel, and the cold-cathode tubes are used together with member(s) such as a diffuser plate and/or a reflector plate. Nowadays, the LED is used as the light source of the backlight. A luminous efficacy of the LED is improved, and expected as a low-power-consumption light source to replace a fluorescent lamp. In the light source for the liquid crystal display device, power consumption of the liquid crystal display device can be reduced by controlling lighting of the LED based on a video picture.

In the liquid crystal display device, many LEDs are disposed instead of the cold-cathode tube in the backlight in which the LED is used as the light source. Although the brightness can evenly be obtained on a surface of the backlight using the many LEDs, unfortunately cost increases because many LEDs are used. In order to solve this drawback, the approach that the number of LEDs is decreased by increasing an output per LED is promoted. For example, Japanese Patent Publication Laid-Open No. 2006-92983 proposes a light emitting device in which the surface light source having the even luminance is obtained by a small number of LEDs.

In order to obtain the surface light source in which the surface light source having the even luminance is obtained by a small number of LEDs, it is necessary to enlarge an illumination region that can be illuminated by one LED. In the light emitting device of Japanese Patent Publication Laid-Open No. 2006-92983, the light from the LED is radially expanded by the lens. Therefore, directionality of the light from the LED is expanded, and a wide range about an optical axis of the LED can be illuminated on the irradiated surface. Specifically, the lens used in the light emitting device of Japanese Patent Publication Laid-Open No. 2006-92983 is formed into a circular shape when viewed from above, and both a light incident surface and a light control output surface are rotationally symmetrical with respect to the optical axis. The light incident surface is formed into a concave surface. In the light control output surface, a portion near the optical axis is formed into a concave surface, and a portion outside the portion near the optical axis is formed into a convex surface.

Generally, in the LED, the largest amount of light is emitted toward a front surface direction of the LED chip. In the lens disclosed in Japanese Patent Publication Laid-Open No. 2006-92983, the light traveling from the light source toward the front surface direction is diffused by refraction on concave surfaces near the optical axis in the light incident surface and the light output surface. Therefore, a wide illuminance distribution is obtained while illuminance near the optical axis is suppressed on the irradiated surface.

SUMMARY

In nowadays that a luminous efficacy of the LED is being improved, there is a demand for a surface light source with the low-cost and energy saving, in which an irradiation area per one light source on the irradiated surface is enlarged, the number of light sources is decreased to the utmost limit, and the illuminance is equalized on the irradiated surface.

In the lens disclosed in Japanese Patent Publication Laid-Open No. 2006-92983, the light control output surface is formed into the concave surface near the optical axis and gently becomes the convex surface with increasing distance from the optical axis, and a bottom surface connecting the light incident surface and the light control output surface is formed into a flat surface. In this shape of the lens disclosed in Japanese Patent Publication Laid-Open No. 2006-92983, a light component that is not refracted but reflected by the light control output surface increases with increasing power that expands the light emitted from the light source, the light component reflected on the light control output surface is reflected by the lens bottom surface and/or a reflecting sheet on an upper surface of a board on which the LED light source is mounted, and the light component is gathered near the optical axis of the irradiated surface. That is, in the lens disclosed in Japanese Patent Publication Laid-Open No. 2006-92983, since the wide illuminance distribution while suppressing the illuminance near the optical axis on the irradiated surface is made by just the shape of the lens surface, there is a limitation to configure such lens in the shape. Additionally, the low-cost and energy-saving surface light source in which the number of light sources is decreased to the utmost limit and the illuminance is equalized on the irradiated surface cannot be constructed in the light emitting device of Japanese Patent Publication Laid-Open No. 2006-92983.

In view of the above demand, the disclosure provides a surface light source in which the illuminance is more even than ever before on the irradiated surface illuminated by the light source and a liquid crystal display device including the surface light source.

In order to solve the problem, the disclosure relates to a surface light source including: a plurality of light emitting devices configured to be disposed in a planar manner; and a diffuser plate configured to be disposed so as to cover the plurality of light emitting devices, and radiate light, which is irradiated from the plurality of light emitting devices to an irradiated surface, while the light is diffused from a radiation surface.

The disclosure relates to a surface light source with light emitting devices in which a plurality of the light emitting devices is disposed in a central portion of the surface light source, the light emitting devices including: a light source having a light-emitting face orthogonal to an optical axis; an incident surface configured to enter light emitted from the light source and expand the incident light; an output surface outputting the incident light; a bottom surface oriented toward an opposite direction to the output surface around the incident surface; and a reflection unit formed in a concave shape with respect to an optical axis on the bottom surface.

Further, the disclosure relates to a liquid crystal display device including: a liquid crystal panel; and the surface light source that disposed on a back of the liquid crystal panel.

According to the configuration described above, in the surface light source including the light emitting device that expands the light emitted from the light source using the lens and the diffuser plate, the surface light source includes the concave reflection unit in the bottom surface of the lens, so that the light from the light source can maximally be expanded to decrease the number of light sources to an utmost limit. Accordingly, the disclosure can construct the low-cost and energy-saving surface light source in which the luminance is equalized.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 18A is a view illustrating an effect of a reflection unit included in a lens in the light emitting device in FIG. 7;

FIG. 19 is a view illustrating a modification of the reflection unit included in the lens; and FIG. 20 is a view illustrating another modification of the reflection unit included in the lens.

DETAILED DESCRIPTION

Hereinafter, embodiments of the disclosure will be described in detail with reference to the drawings. However, the detailed description beyond necessity is occasionally omitted. For example, the detailed description of a well-known item and the detailed description of a substantially identical configuration are occasionally omitted. Therefore, the unnecessarily redundant description is avoided for the purpose of easy understanding of those skilled in the art.

The inventors provide the accompanying drawings and the following description in order that those skilled in the art sufficiently understand the disclosure, however the scope defined by the appended claims is not limited by the accompanying drawings and the following description.

First Embodiment

Figure 1:
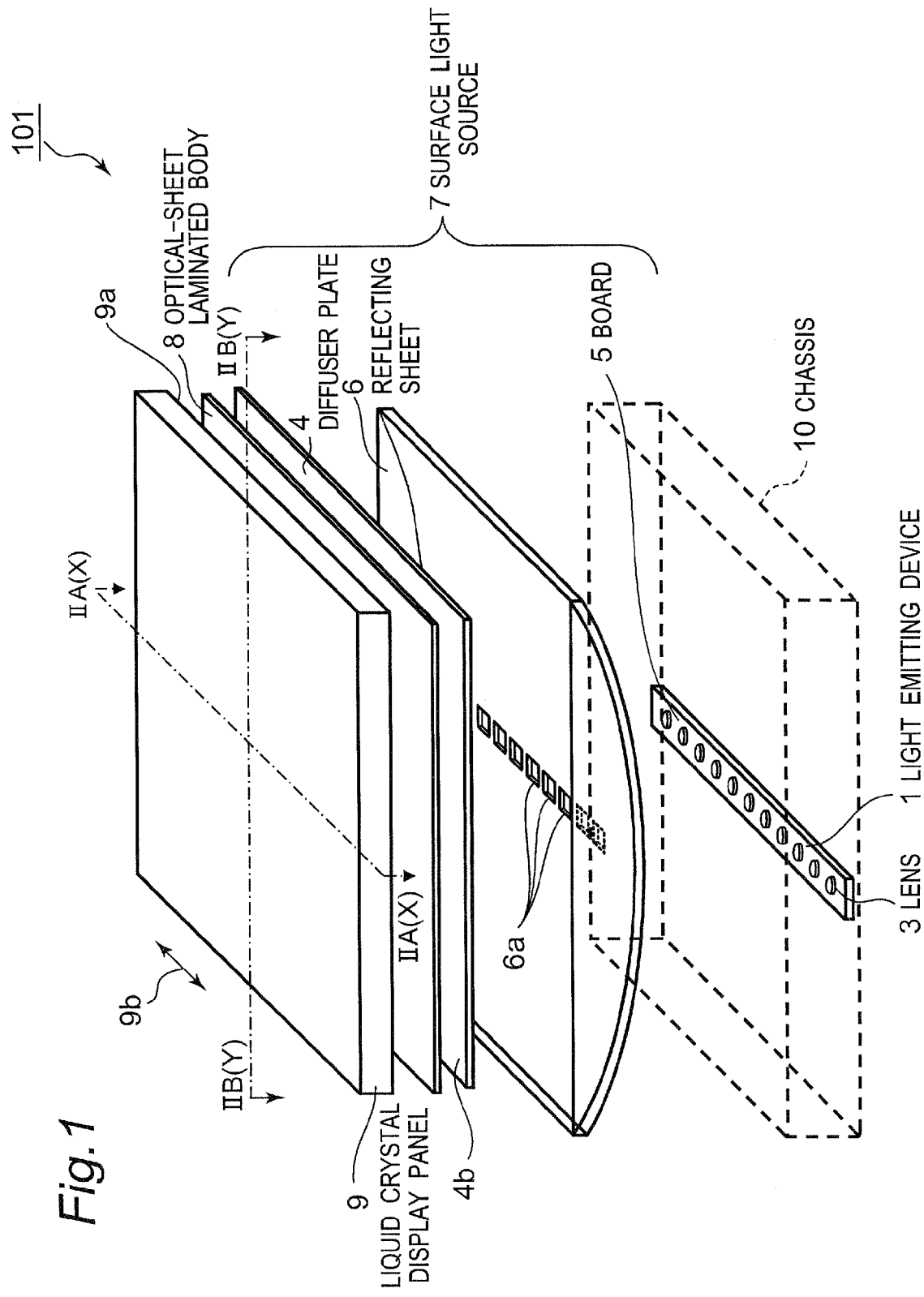
FIG. 1 is a configuration diagram of a liquid crystal display device according to a first embodiment of the disclosure.
Figure 2:
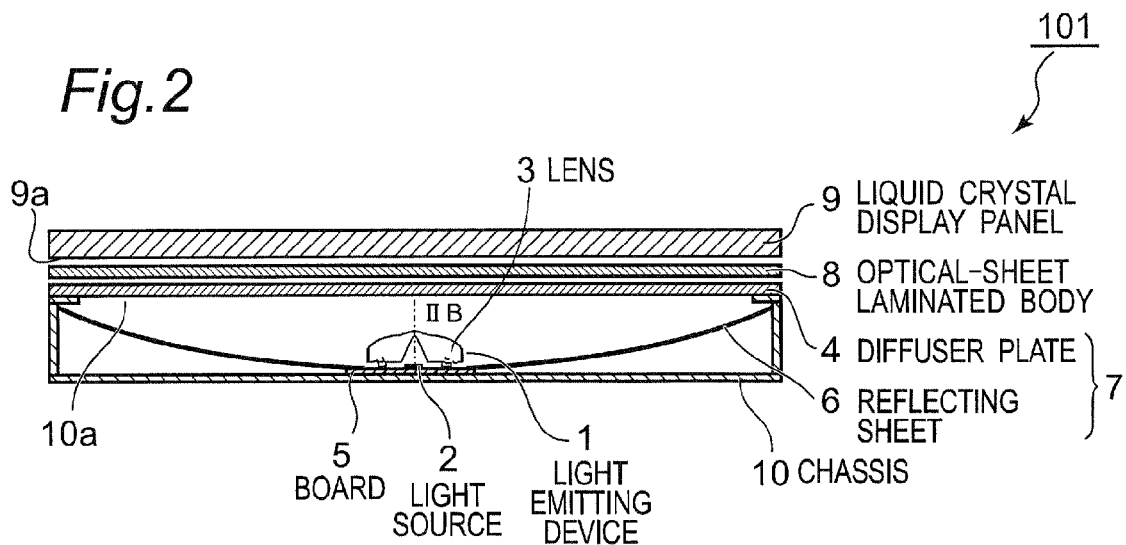
FIG. 2 is a sectional view taken on a line IIA(X)-IIA(X) of FIG. 1.

FIG. 1 is an exploded perspective view illustrating a whole schematic configuration of a liquid crystal display device 101 according to a first embodiment of the disclosure. FIG. 2 is a sectional view taken on a line IIA(X)-IIA(X) of FIG. 1.

As illustrated in FIGS. 1 and 2, the liquid crystal display device 101 includes a transmissive liquid crystal display panel 9 having a rectangular flat-plate shape, and a rectangular parallelepiped surface light source 7 having a size corresponding to the liquid crystal display panel 9. The surface light source 7 is disposed on a side of a back surface 9a (a non-display surface side) of the liquid crystal display panel 9. The surface light source 7 acts as a backlight of the liquid crystal display panel 9, and an LED is used as a light source of the surface light source 7.

The surface light source 7 includes a plurality of light emitting devices 1 that are linearly disposed along a long-side direction 9b of the liquid crystal display panel 9 so as to be faced to a central portion of the liquid crystal display panel 9, a rectangular parallelepiped chassis 10 that accommodates the light emitting devices 1 therein, a diffuser plate 4 that is disposed between the liquid crystal display panel 9 and the light emitting devices 1 so as to cover an aperture 10a of the chassis 10, and a reflecting sheet 6 that is disposed in the chassis 10 to reflect light emitted from the light emitting device 1 onto the side of the back surface 9a of the liquid crystal display panel 9, namely, the side of the diffuser plate 4. The diffuser plate 4 extends while being orthogonal to an optical axis of the light emitting device 1. In the first embodiment, the reflecting sheet 6 is constructed by a circular arc sheet material having continuously provided reflecting faces that are curved along the long-side direction 9b of the liquid crystal display panel 9, and has side plates that warp to the outside of the surface light source 7, the side plates being provided in both end portions in the long-side direction 9b. The reflecting sheet 6 also has a circular arc or tilt shape along a short-side direction. The shape of the reflecting sheet 6 is not limited to the circular arc shape of the first embodiment. As described in detail later, the light emitting device 1 includes an LED light source 2 and a lens 3 that is disposed so as to cover the light source 2.

The diffuser plate 4 includes an optical sheet laminated body 8 having a size equivalent to the liquid crystal display panel 9 on a radiation surface 4b (see FIG. 6), the radiation surface 4b being disposed opposite to the back surface 9a of the liquid crystal display panel 9, namely a surface that emits light. An irradiated surface 4a (see FIG. 6) of the diffuser plate 4, which is disposed opposite to the radiation surface 4b, is irradiated with the light from the light emitting device 1. For example, the optical-sheet laminated body 8 is constructed by a prism sheet that collects the light incident from the diffuser plate 4 toward the side of the liquid crystal display panel 9 in front of the body 8, a diffusion sheet that additionally diffuses the light incident from the diffuser plate 4, a polarizing sheet that transmits the light having a specific polarization plane such that the polarization plane of the incident light corresponds to the polarization plane of the liquid crystal display panel 9, and the like. In the first embodiment, the light emitting devices 1 are linearly disposed opposite to the central portion of the liquid crystal display panel 9, whereby the light emitting devices 1 are disposed in the substantially central portion of the surface light source 7.

Figure 3:
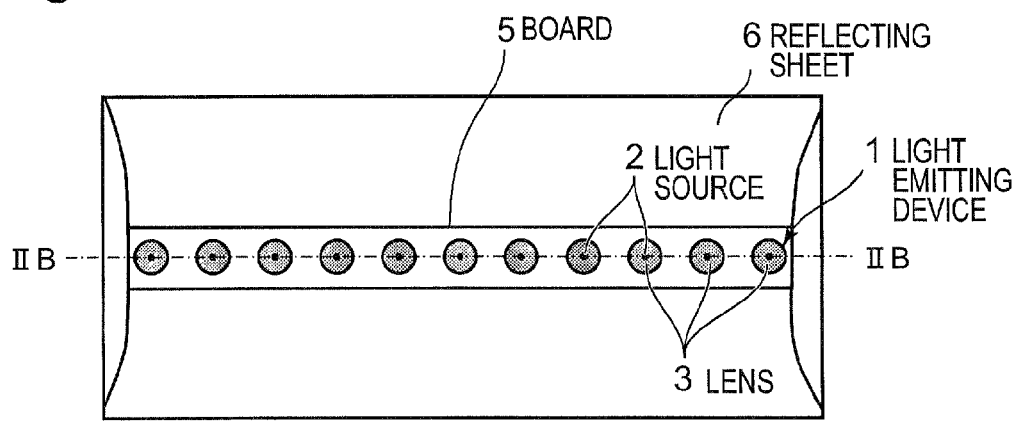
FIG. 3 is a plan view illustrating a light emitting device of the surface light source in FIG. 1.

FIG. 3 is a plan view illustrating the light emitting device 1 of the surface light source 7.

The light emitting devices 1 are disposed at predetermined intervals on a surface of a strip-shaped, insulating board 5 on which a predetermined wiring pattern is formed at a rear surface side.

Figure 4:
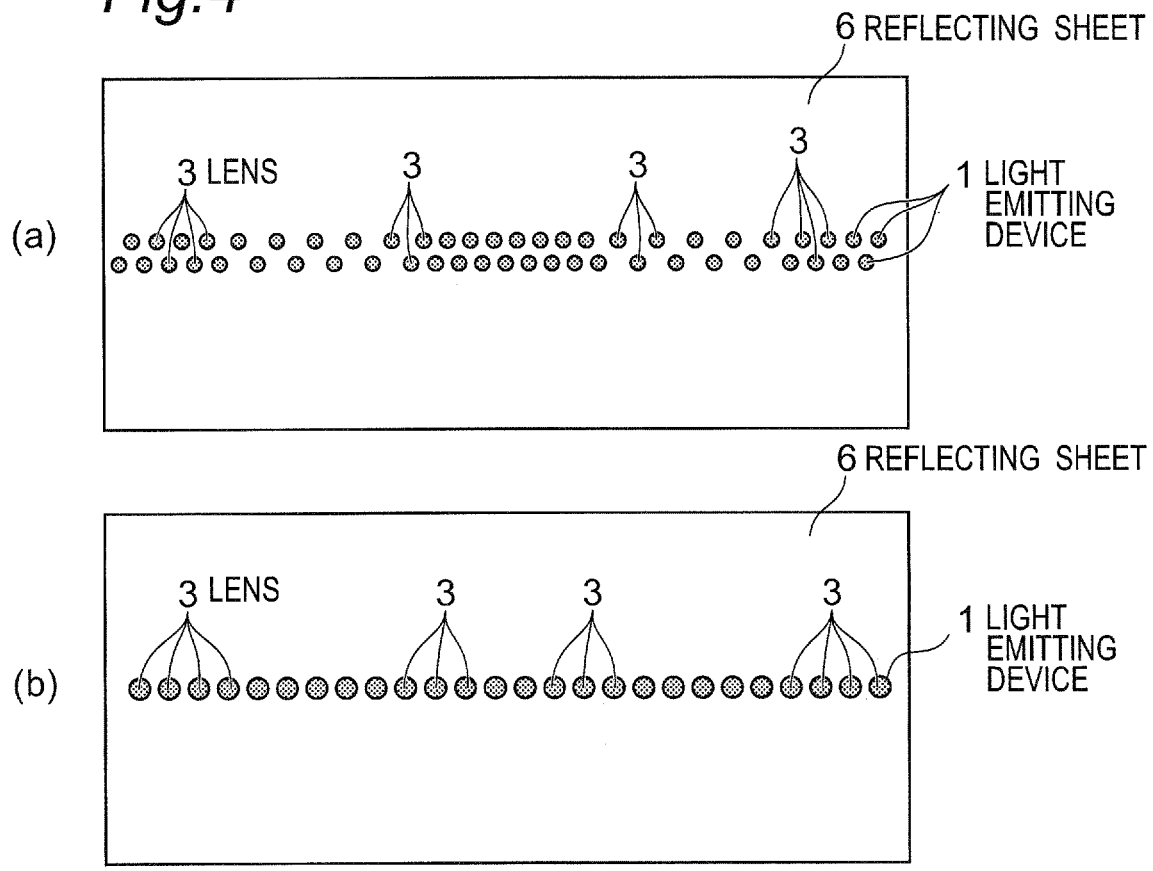
FIG. 4 shows plan views, each of which illustrates an example of an array of the light emitting device.

In the first embodiment, as illustrated in (a) of FIG. 4, the light emitting devices 1 are linearly disposed in two lines along the long-side direction 9b at the central portions of the liquid crystal display panel 9 and the diffuser plate 4. In the (a) of FIG. 4, the light emitting devices 1 are arrayed in a zigzag manner in the lines adjacent to each other. Alternatively, the light emitting devices 1 may be arrayed not in the zigzag manner, but at the same position in the lines adjacent to each other. As to the number of arrayed lines, the light emitting devices 1 may be arrayed in one (see (b) of FIG. 4) or three lines as long as the light emitting devices 1 are linearly arrayed in central portion.

In the surface light source 7, as mentioned above, when the light emitting devices 1 are linearly arrayed at the central portion, luminance distributions of lens arrays overlap each other, allowing reduction of unevenness of the luminance distribution. Additionally, when the light emitting devices 1 are linearly arrayed in central portion, brightness is sufficiently ensured as the surface light source 7, and the surface light source 7 can be constructed by few light sources 2 and lenses 3 at low cost.

Based on experiments performed by the inventors, when the light emitting devices are linearly arrayed in one line to be opposite to the central portion of the liquid crystal display panel, a small amount of light may be output from the diffuser plate and then the sufficient brightness at end portions of the surface light source may not be ensured. In such a case, a large-output light source can be used, however it makes the cost increase. On the other hand, in the liquid crystal display device 101, it is necessary that the central portion of the screen be brighter than a peripheral portion. Therefore, a disposition pitch of the light emitting devices 1 is not kept constant, but the light emitting devices 1 are optionally disposed so as to become dense, coarse, and dense from the central portion toward the peripheral portion. Accordingly, such disposition can construct the surface light source 7 having the low-unevenness luminance distribution in which the necessary brightness is ensured to the end portions while ensuring the sufficient brightness in the central portion of the screen.

In the LED light source 2, a light emitting element emitting blue light is sealed by a fluorescent material of a YAG-based and/or a TAG-based, etc., thereby generating pseudo-white light. Therefore, at this time, the LED light source that emits light having an even color in all the directions is rarely used from the viewpoint of cost. Accordingly, color unevenness is generated. However, an X-direction having a large difference of a light emitting region between the different colors is aligned with the direction in which the light emitting devices 1 are linearly arrayed to increase overlapping of the unevenly-colored portions, so that the color unevenness can maintain inconspicuous in the surface light source 7. Additionally, a direction in which the lens 3 has a weak refractive power is also aligned with the linearly-arrayed direction, so that not only the color unevenness is suppressed but also the necessary brightness can be ensured in the end portions of the surface light source 7. The problem of the color unevenness mentioned above is caused by the configuration in which the light emitting devices 1 are arrayed in line at the central portion of the surface light source 7 like the first embodiment. On the other hand, the problem of the above color unevenness is not generated in the conventional backlight because in the conventional backlight, a light source and a light guide plate are disposed at a lateral edge of the liquid crystal display panel, so that the light is diffused by the light guide plate.

The light source 2 and the lens 3, which constitute the light emitting device 1, are described later in detail in a third embodiment.

Second Embodiment

Figure 5:
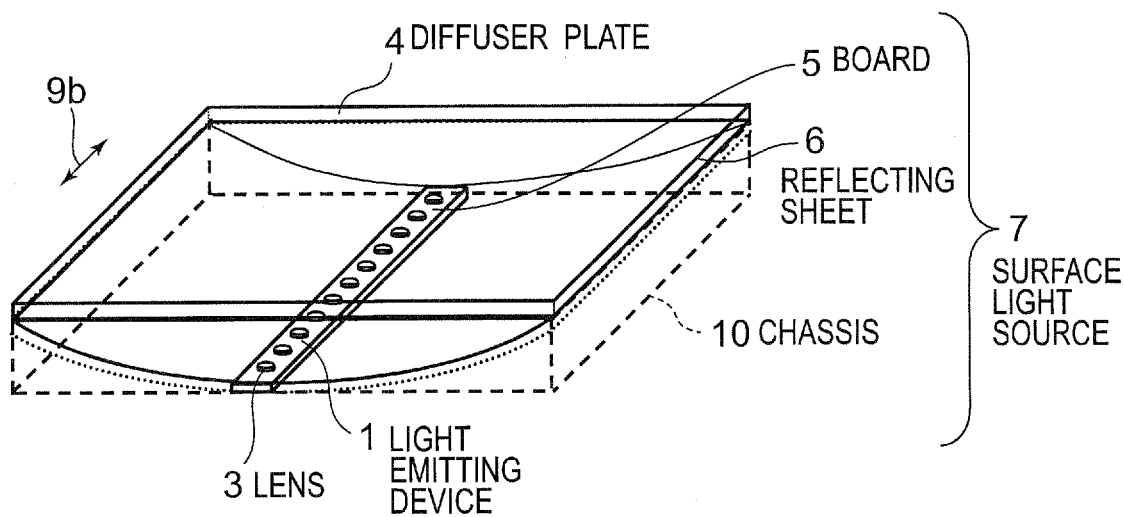
FIG. 5 is a configuration diagram of a surface light source according to a second embodiment of the disclosure.

The surface light source 7 according to a second embodiment of the disclosure will be described in detail. FIG. 5 is a configuration diagram of the surface light source 7. As described in the first embodiment, the surface light source 7 includes the plural light emitting devices 1, each of which includes the light source 2 and the lens 3 and is arrayed in line along the long-side direction 9b while being opposite to the central portion of the liquid crystal display panel 9, and the diffuser plate 4 that is disposed so as to cover the light emitting devices 1. As described above, the light source 2 and the lens 3, which constitute the light emitting device 1, are described in detail in the third embodiment.

Figure 6:
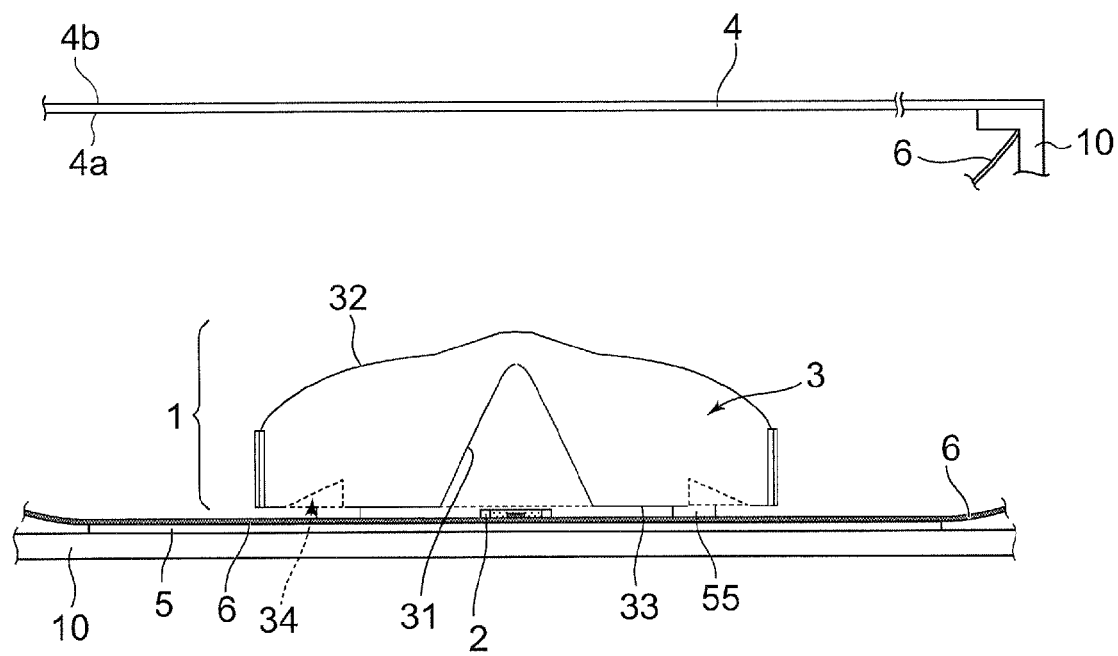
FIG. 6 is a partial sectional view of the surface light source in FIG. 5.

As illustrated in FIG. 6, the surface light source 7 includes the board 5 that is disposed opposite to the diffuser plate 4 with the light emitting devices 1 interposed therebetween. On the board 5, the LED light source 2 of each light emitting device 1 is mounted. The lens 3 is placed on the board 5 while covering the light source 2. In the second embodiment, a bottom surface 33 of the lens 3 is bonded to the board 5 with support posts 55 interposed therebetween. Further, the reflecting sheet 6 is disposed between the board 5 and the diffuser plate 4 such that the reflecting sheet 6 covers the board 5 while avoiding the light source 2, namely, such that the reflecting sheet 6 covers the board 5 while exposing the light source 2. Alternatively, a reflecting coating may be provided on the board 5 instead of the reflecting sheet 6. The reflecting sheet 6 and the reflecting coating correspond to an example of the reflecting member. As illustrated in FIG. 1, a window 6a is formed according to each light emitting device 1 in the reflecting sheet 6. It is not always necessary that the bottom surface 33 of the lens 3 is bonded to the board 5 with the support posts 55 interposed therebetween, but the bottom surface 33 may directly be bonded to the board 5. The support posts 55 may be formed while being integral with the lens 3.

The light emitting devices 1 irradiate the irradiated surface 4a of the diffuser plate 4 with the light. The diffuser plate 4 diffuses light irradiated to the irradiated surface 4a and then radiates the light from the radiation surface 4b. Each light emitting device 1 emits the light such that a wide range of the irradiated surface 4a of the diffuser plate 4 has the even illuminance, and the light is diffused by the diffuser plate 4, allowing the construction of the surface light source in which a small amount of luminance unevenness is generated.

The light from the light emitting devices 1 is diffused by the diffuser plate 4 to return to the side of the light emitting devices 1 and/or to be transmitted through the diffuser plate 4. The light, which returns to the side of the light emitting devices 1 to impinge on the reflecting sheet 6, is reflected by the reflecting sheet 6 and enters to the diffuser plate 4 again.

Third Embodiment

Figure 7:
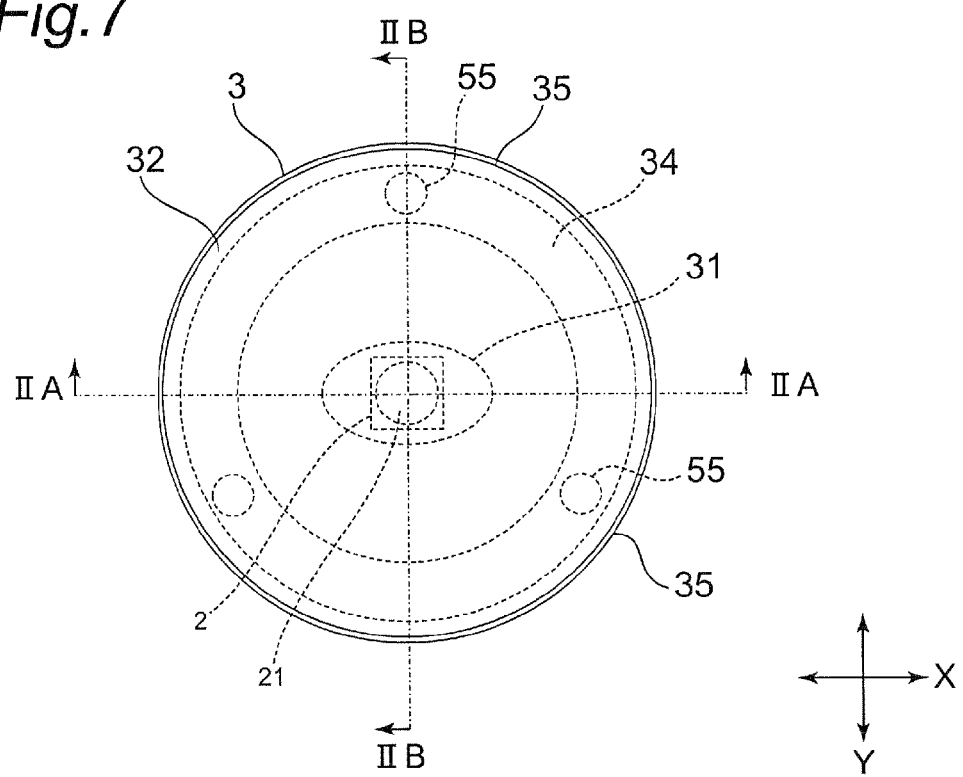
FIG. 7 is a plan view of a light emitting device according to a third embodiment of the disclosure.
Figure 8A:
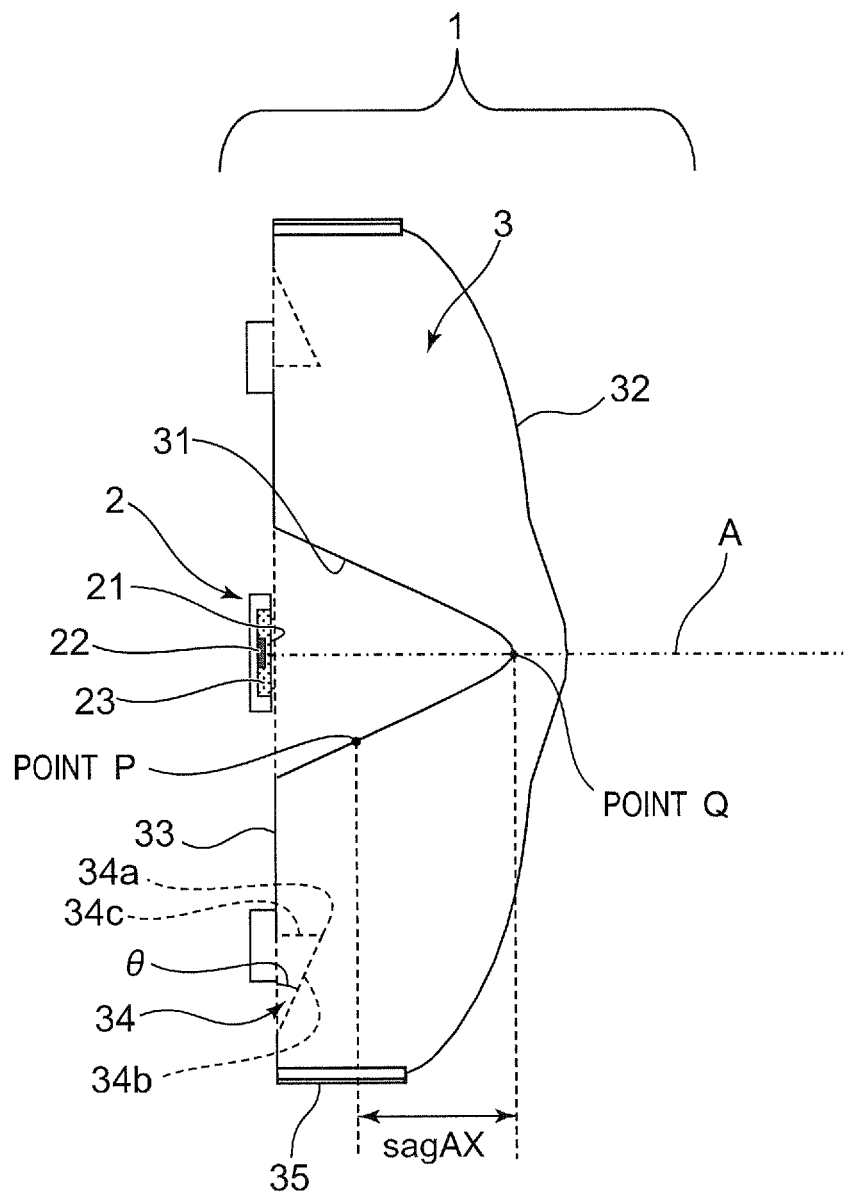
FIG. 8A is a sectional view taken on a line IIA-IIA of FIG. 7.
Figure 8B:
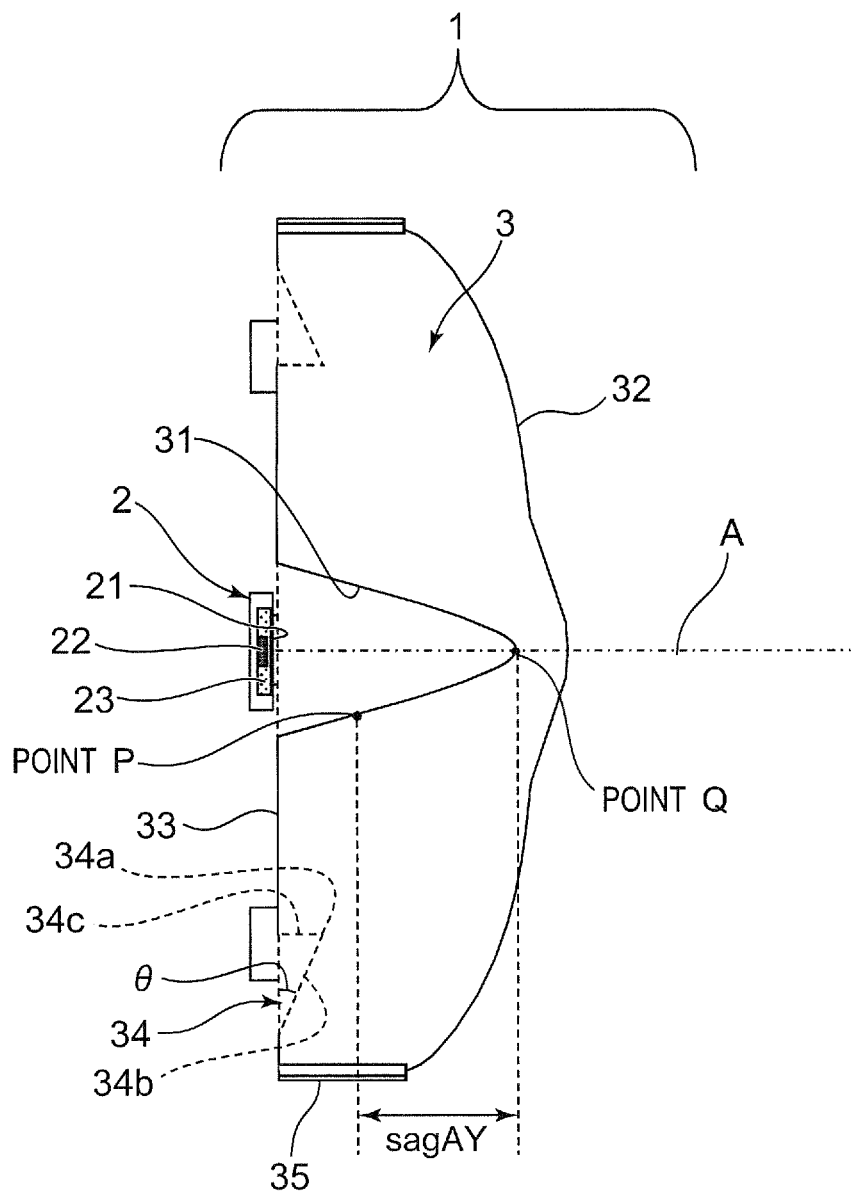
FIG. 8B is a sectional view taken on a line IIB-IIB of FIG. 7.

The light emitting device 1 according to a third embodiment of the disclosure will be described in detail. FIGS. 7, 8A, and 8B are views illustrating a configuration of the light emitting device 1. As described above, the light emitting device 1 includes the light source 2 and the lens 3 that radially expands the light emitted from the light source 2. For example, the light emitting device 1 radiates light onto the irradiated surface 4a of the diffuser plate 4 at an optical axis A and at the substantially circular shape around the optical axis A. That is, directionality of the light emitted from the light source 2 is expanded by the lens 3, whereby the wide range of the irradiated surface 4a of the diffuser plate 4 is illuminated at the optical axis A and around the optical axis A. The illuminance distribution on the irradiated surface 4a becomes the maximum at the optical axis A, and is monotonously decreased toward a surrounding region from the optical axis A.

The lens 3 is made of a transparent material having a predetermined refractive index. For example, the refractive index of the transparent material ranges from about 1.4 to about 2.0. The transparent material can use, for example, resins, such as an epoxy resin, a silicone resin, an acrylic resin, and polycarbonate, glass, and rubbers, such as a silicone rubber. Among others, the epoxy resin, the silicone rubber, and the like, which are conventionally used as an LED sealing resin, can be used for the lens 3.

Specifically, as illustrated in FIG. 8A, the lens 3 includes an incident surface 31 to which the light from the light source 2 is entered and an output surface 32 from which the light entered to the lens 3 is output. A maximum outer diameter of the output surface 32 defines an effective diameter of the lens 3. The lens 3 also includes the bottom surface 33. The bottom surface 33 is located around the incident surface 31, and located on the opposite side to the output surface 32 in the optical axis direction. A reflection unit 34, which is formed into a circular or elliptical shape around the optical axis A, is provided in the bottom surface 33. In the third embodiment, a ring part 35 is provided between the output surface 32 and the bottom surface 33 so as to overhang the outside in the radial direction of the lens 3. The ring part 35 has a substantially U-shape in section, and an outer circumferential edge of the output surface 32 and an outer circumferential edge of the bottom surface 33 are coupled by the ring part 35. However, the ring part 35 may be eliminated, and the outer circumferential edge of the output surface 32 and the outer circumferential edge of the bottom surface 33 may be coupled by an end surface having a linear shape or a circular arc shape in section. The components of the lens 3 will further be described in detail below.

In the third embodiment, the incident surface 31 is a continuously concave surface, and is an anamorphic curved surface in which the X-direction differs from the Y-direction in a curved configuration as illustrated in FIG. 7, whereby the X-direction differs from the Y-direction in the refractive power. It is not always necessary that the X-direction differs from the Y-direction in the refractive power of the incident surface 31, but the incident surface 31 may be formed into a rotationally symmetric shape with respect to the optical axis A based on a characteristic of the light source 2.

At this point, it is noted that the refractive power does not mean a concept of a lens "power" that is generally used in design of an optical system and/or design of an imaging system, namely, does not mean that a curvature of the lens varies near the optical axis in the case of an aspherical lens. As used in the present Specification and Claim, the "refractive power" means a concept in which, in the incident surface 31 having a shape equivalent to a surface of a spheroid, the cross-sectional shape orthogonal to the optical axis A has the elliptical shape at any position in the optical axis direction. In other words, the X-direction differs from the Y-direction in a distance from the optical axis A, or the X-direction differs from the Y-direction in the direction in which the light is emitted from the incident surface 31, namely, a direction of the light distribution is different even when light has the same angle of incident from the light source 2 to the incident surface 31. Hereinafter the curved surface having the above configuration is referred to as "anamorphic".

Particularly, as illustrated in FIGS. 8A and 8B, the incident surface 31 has a vertex Q on the optical axis A. Assuming that a sag amount (as to a sign, from a vertex Q toward the side of the light source 2 is negative, and the opposite side to the light source 2 from the vertex Q is positive) is a distance along the optical axis A from the vertex Q to a point P (that is, a distance in the optical axis direction) on the incident surface 31, the incident surface 31 has a shape in which a sag amount sagAX in the X-direction differs from a sag amount sagAY in the Y-direction at the same positions separated from the optical axis A with the same distance R in the radial direction (that is, on a concyclic point about the optical axis A). The incident surface 31 may extend toward the side of the light source 2, after the incident surface 31 retreats from the vertex Q toward the opposite side to the light source 2 such that the sag amount becomes positive near the optical axis A.

The reflection unit 34 is provided in a concentric manner with respect to an outer circumference of the incident surface 31 or an outer circumference of the output surface 32. The reflection unit 34 has a triangular shape convex toward the side of the output surface 32 in section. A slope surface 34b on the outer circumferential side of the lens of a triangular vertex 34a of the reflection unit 34 is longer than a slope surface 34c on the side of the optical axis A, and a slope angle of the slope surface 34b is smaller than that of the slope surface 34c.

For example, an angle θ formed between the reflection unit 34 and the bottom surface 33 ranges from greater than 15° to less than 45°. When the angle is less than or equal to 15°, the effect for suppressing the illuminance near the optical axis of the irradiated surface 4a of the diffuser plate 4 is decreased. When the angle is greater than or equal to 45°, the reflection unit 34 is directly irradiated with the light emitted from the light source 2, which results in the illuminance unevenness on the irradiated surface 4a.

Beneficially, the reflection unit 34 is located on the outside in which a distance from the optical axis A to the reflection unit 34 is greater than or equal to 65% of the effective diameter of the lens 3. It is because the light reflected from the side of the output surface 32 concentrates on the outside of the bottom surface 33, it is necessary to efficiently reflect the above reflected light toward the side of the output surface 32, and the insufficient effect is obtained when the reflection unit 34 is provided near the optical axis A.

FIG. 18A illustrates an example of a light path as light 62 that is reflected by the reflection unit 34 among the light emitted from the light source 2. Even the light reflected toward the inward of the lens 3 by the output surface 32 can be reflected toward the outer circumferential direction of the lens 3 by the reflection unit 34 again, and the reflection unit 34 can orient the light from the light source 2 in the direction in which the light is more widely expanded.

Figure 18B:
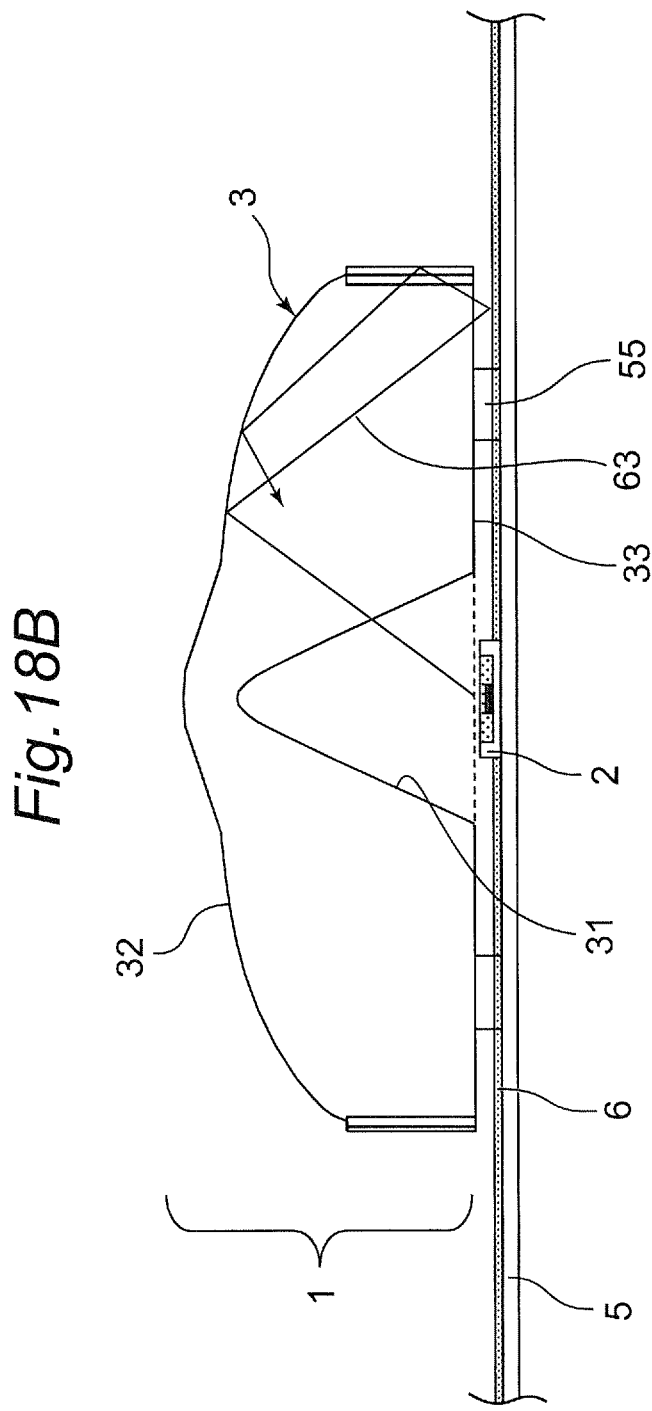
FIG. 18B is a view contrasted with FIG. 18A and a view illustrating an light path when the reflection unit is absent in the lens.

On the other hand, in the case that the reflection unit 34 is not provided in the lens 3 as illustrated in FIG. 18B, sometimes light 63 reflected toward the inward of the lens 3 by the output surface 32 is transmitted through the lens 3, reflected by a reflecting member, such as the reflecting sheet 6 of the board 5, and enters to the lens 3 to be reflected toward the side of the light source 2 by the output surface 32 again. As can be seen from FIGS. 18A and 18B, the light from the light source 2 is maximally expanded toward the outer circumferential side of the lens 3 by providing the reflection unit 34, which allows the number of light sources to be decreased to an utmost limit.

Figure 9:
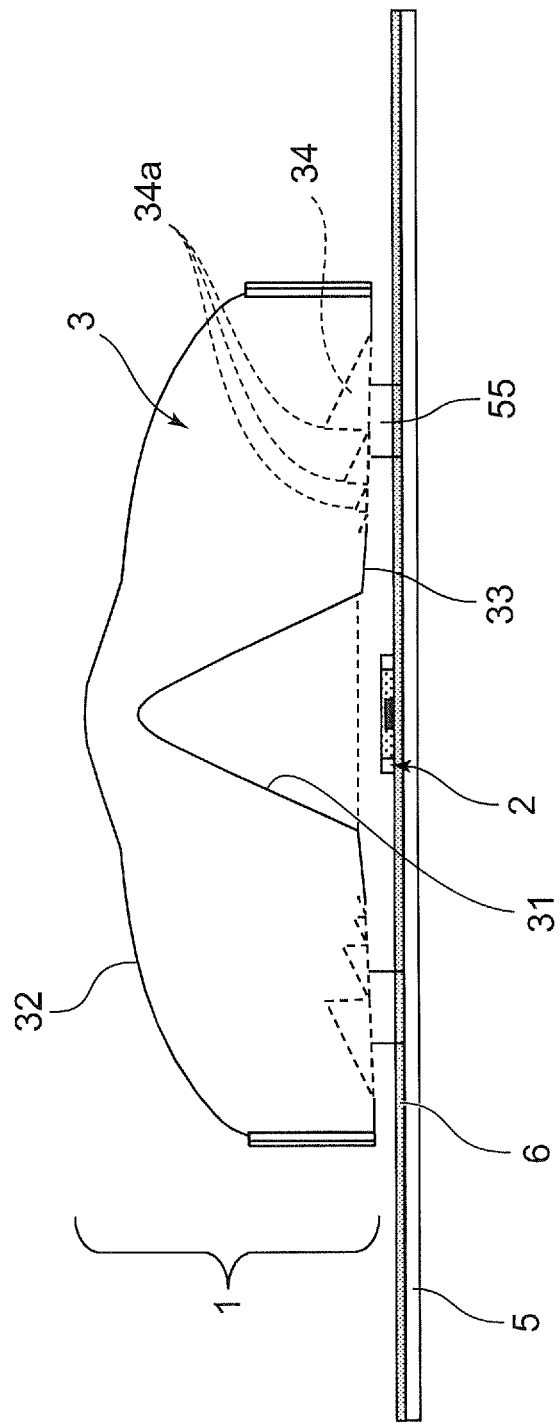
FIG. 9 is a sectional view illustrating the light emitting device of the third embodiment.

As illustrated in FIG. 9, many reflection units 34 may be provided in the bottom surface 33. At this point, for example, the vertex 34a of the reflection unit 34 becomes lower as the reflection unit 34 is located closer to the optical axis A, and the vertex 34a becomes higher as the reflection unit 34 is located farther away from the optical axis A.

The reflection unit 34 is not limited to the shape in FIGS. 8A and 8B. For example, the slope surface 34c on the side of the optical axis A may be sloped toward the outer circumferential side of the lens 3 as illustrated in FIG. 19, or the slope surface 34b on the outer circumferential side of the lens 3 may be formed into a circular arc surface convex toward the side of the output surface 34 as illustrated in FIG. 20. The shapes illustrated in FIGS. 8, 19, and 20 may properly be combined.

The reflection unit 34 in which the shapes illustrated in FIGS. 8, 19, and 20 may properly be combined can maximally expand the light from the light source 2 to decrease the number of light sources to the utmost limit.

However, the shape in which the slope surface 34c on the side of the optical axis A is sloped toward the side of the optical axis A may be avoided because the effect to expand the light from the light source 2 is not always obtained.

The light source 2 is disposed away from the incident surface 31 of the lens 3. In the third embodiment, the output surface 32 is a continuously convex surface that is rotationally symmetrical with respect to the optical axis A. For example, the cyclic bottom surface 33 surrounding the incident surface 31 is flat. In the third embodiment, the light-emitting face 21 of the light source 2 is substantially positioned at the same level of the flat bottom surface 33 in the optical axis direction in which the optical axis A extends.

The bottom surface 33 may be sloped toward the outside of the lens 3 from the optical axis A. In FIG. 9, the bottom surface 33 is sloped such that the inside of the lens 3 is concave compared with the outside of the lens 3. The bottom surface 33 may have the opposite slope to the slope in FIG. 9.

After entering to the lens 3 from the incident surface 31, the light from the light source 2 is output from the output surface 32, and reaches the irradiated surface 4a of the diffuser plate 4. The light emitted from the light source 2 is extended by refraction actions of the incident surface 31 and the output surface 32, and reaches the wide range of the irradiated surface 4a.

According to the light emitting device 1, the lens can have the small size, and the light from the light source 2 can maximally be expanded.

Example 1

The light emitting device 1 of Example 1 will be described below as a specific numerical example of the disclosure.

Figure 10:
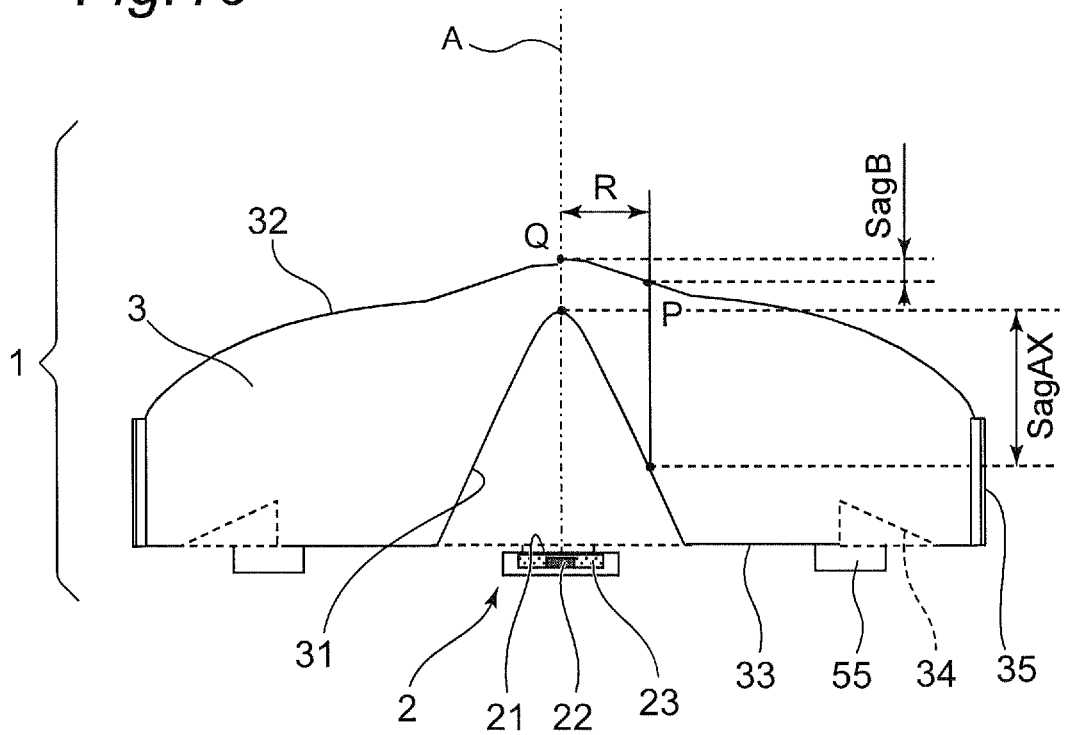
FIG. 10 is an explanatory view of a light emitting device according to Example 1.

FIG. 10 is a sectional view of the light emitting device 1 of Example 1. The lens 3, in which the whole surface of the incident surface 31 is the anamorphic curved surface while the output surface 32 is rotationally symmetrical, is used in Example 1.

In FIG. 10, the numerals Q, P, and sagAX (sagAY) are identical to those in FIGS. 8A and 8B. In FIG. 10, the numeral sagB designates a sag amount in the output surface 32 at the position located with the distance R away from the optical axis A.

Example 1

In Example 1, the general-purpose LED in which the light-emitting face 21 has a size φ of about 3.0 mm is used as the light source 2 in order that the directionality of the light from the light source 2 is expanded and the color unevenness is suppressed. In Example 1, the lens 3 has an effective diameter of 20.7 mm. The lens has a thickness of 1.2 mm at the center of the optical axis. Table 1 illustrates specific numerical values of Example 1.

TABLE 1

| X-axis | SagAX | Y-axis | SagAY | X- or Y-axis | SagB | X- or Y-axis | SagB |
|---|---|---|---|---|---|---|---|
| 0.00 | 0.000 | 0.00 | 0.000 | 0.00 | 0.000 | 5.30 | −0.709 |
| 0.05 | −0.004 | 0.05 | −0.005 | 0.10 | 0.000 | 5.40 | −0.724 |
| 0.10 | −0.016 | 0.10 | −0.018 | 0.20 | −0.001 | 5.50 | −0.741 |
| 0.15 | −0.035 | 0.15 | −0.042 | 0.30 | −0.002 | 5.60 | −0.759 |
| 0.20 | −0.062 | 0.20 | −0.074 | 0.40 | −0.004 | 5.70 | −0.777 |
| 0.25 | −0.096 | 0.25 | −0.115 | 0.50 | −0.007 | 5.80 | −0.797 |
| 0.30 | −0.138 | 0.30 | −0.165 | 0.60 | −0.013 | 5.90 | −0.818 |
| 0.35 | −0.187 | 0.35 | −0.224 | 0.70 | −0.019 | 6.00 | −0.840 |
| 0.40 | −0.242 | 0.40 | −0.292 | 0.80 | −0.028 | 6.10 | −0.863 |
| 0.45 | −0.303 | 0.45 | −0.367 | 0.90 | −0.038 | 6.20 | −0.888 |
| 0.50 | −0.371 | 0.50 | −0.452 | 1.00 | −0.050 | 6.30 | −0.914 |
| 0.55 | −0.445 | 0.55 | −0.544 | 1.10 | −0.064 | 6.40 | −0.941 |
| 0.60 | −0.524 | 0.60 | −0.644 | 1.20 | −0.079 | 6.50 | −0.970 |
| 0.65 | −0.608 | 0.65 | −0.751 | 1.30 | −0.096 | 6.60 | −0.999 |
| 0.70 | −0.697 | 0.70 | −0.866 | 1.40 | −0.114 | 6.70 | −1.030 |
| 0.75 | −0.791 | 0.75 | −0.987 | 1.50 | −0.132 | 6.80 | −1.062 |
| 0.80 | −0.889 | 0.80 | −1.116 | 1.60 | −0.152 | 6.90 | −1.095 |
| 0.85 | −0.991 | 0.85 | −1.251 | 1.70 | −0.173 | 7.00 | −1.129 |
| 0.90 | −1.097 | 0.90 | −1.392 | 1.80 | −0.193 | 7.10 | −1.164 |
| 0.95 | −1.206 | 0.95 | −1.540 | 1.90 | −0.214 | 7.20 | −1.200 |
| 1.00 | −1.318 | 1.00 | −1.693 | 2.00 | −0.235 | 7.30 | −1.237 |
| 1.05 | −1.434 | 1.05 | −1.851 | 2.10 | −0.256 | 7.40 | −1.275 |
| 1.10 | −1.552 | 1.10 | −2.015 | 2.20 | −0.277 | 7.50 | −1.313 |
| 1.15 | −1.673 | 1.15 | −2.184 | 2.30 | −0.297 | 7.60 | −1.353 |
| 1.20 | −1.796 | 1.20 | −2.358 | 2.40 | −0.317 | 7.70 | −1.394 |
| 1.25 | −1.922 | 1.25 | −2.536 | 2.50 | −0.336 | 7.80 | −1.437 |
| 1.30 | −2.050 | 1.30 | −2.719 | 2.60 | −0.354 | 7.90 | −1.481 |
| 1.35 | −2.180 | 1.35 | −2.906 | 2.70 | −0.371 | 8.00 | −1.526 |
| 1.40 | −2.311 | 1.40 | −3.097 | 2.80 | −0.388 | 8.10 | −1.574 |
| 1.45 | −2.445 | 1.45 | −3.292 | 2.90 | −0.405 | 8.20 | −1.624 |
| 1.50 | −2.580 | 1.50 | −3.490 | 3.00 | −0.420 | 8.30 | −1.676 |
| 1.55 | −2.716 | 1.55 | −3.692 | 3.10 | −0.435 | 8.40 | −1.731 |
| 1.60 | −2.854 | 1.60 | −3.897 | 3.20 | −0.449 | 8.50 | −1.788 |
| 1.65 | −2.994 | 1.65 | −4.105 | 3.30 | −0.463 | 8.60 | −1.848 |
| 1.70 | −3.134 | 1.70 | −4.317 | 3.40 | −0.476 | 8.70 | −1.911 |
| 1.75 | −3.276 | 1.75 | −4.531 | 3.50 | −0.488 | 8.80 | −1.977 |
| 1.80 | −3.419 | 1.80 | −4.748 | 3.60 | −0.501 | 8.90 | −2.045 |
| 1.85 | −3.563 | 1.85 | −4.967 | 3.70 | −0.513 | 9.00 | −2.116 |

TABLE 1-continued

| X-axis | SagAX | Y-axis | SagAY | X- or Y-axis | SagB | X- or Y-axis | SagB |
|---|---|---|---|---|---|---|---|
| 1.90 | −3.708 | 1.90 | −5.189 | 3.80 | −0.525 | 9.10 | −2.190 |
| 1.95 | −3.853 | 1.95 | −5.414 | 3.90 | −0.536 | 9.20 | −2.268 |
| 2.00 | −4.000 | 1.97 | −5.500 | 4.00 | −0.547 | 9.30 | −2.349 |
| 2.05 | −4.147 | | | 4.10 | −0.559 | 9.40 | −2.435 |
| 2.10 | −4.296 | | | 4.20 | −0.570 | 9.50 | −2.528 |
| 2.15 | −4.445 | | | 4.30 | −0.581 | 9.60 | −2.629 |
| 2.20 | −4.594 | | | 4.40 | −0.593 | 9.70 | −2.741 |
| 2.25 | −4.745 | | | 4.50 | −0.604 | 9.80 | −2.866 |
| 2.30 | −4.895 | | | 4.60 | −0.616 | 9.90 | −3.006 |
| 2.35 | −5.047 | | | 4.70 | −0.628 | 10.00 | −3.165 |
| 2.40 | −5.199 | | | 4.80 | −0.640 | 10.10 | −3.340 |
| 2.50 | −5.500 | | | 4.90 | −0.653 | 10.20 | −3.530 |
| | | | | 5.00 | −0.666 | 10.30 | −3.725 |
| | | | | 5.10 | −0.680 | 10.35 | −3.819 |
| | | | | 5.20 | −0.694 | | |

Figure 11A:
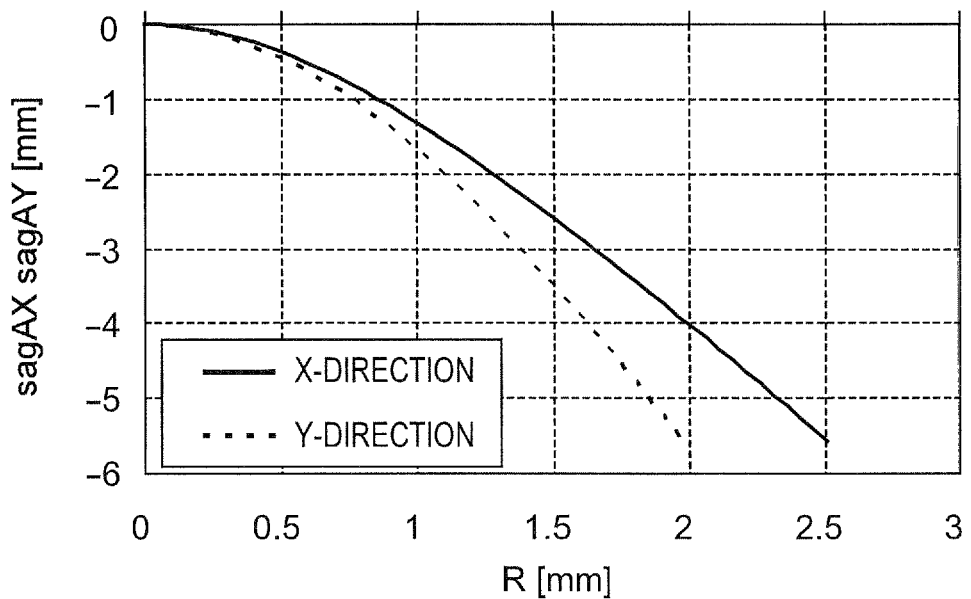
FIG. 11A is a graph (of Table 1) illustrating a relationship between R and, sagAX and sagAY, which indicates an incident surface shape of a lens used in the light emitting device of Example 1.
Figure 11B:
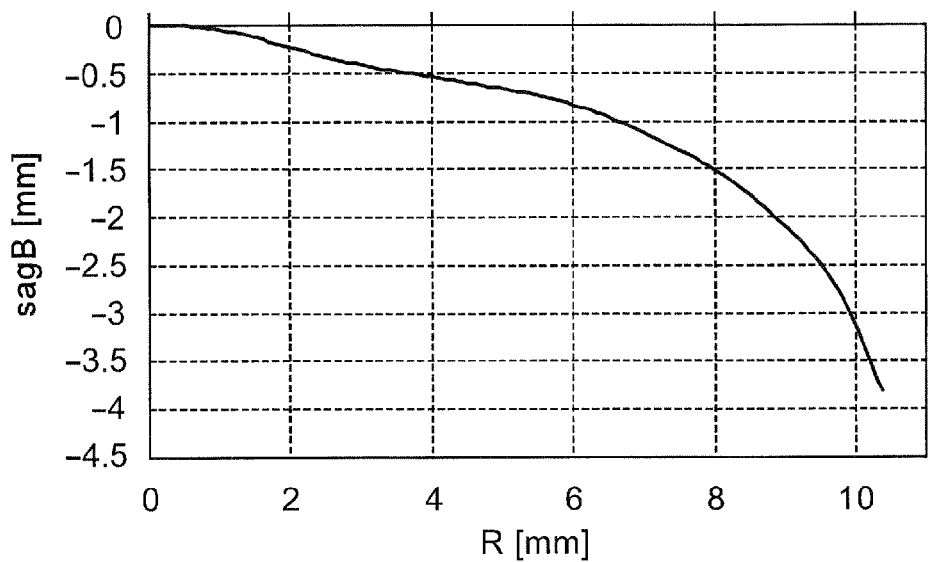
FIG. 11B is a graph (of Table 1) illustrating a relationship between R and sagB, which indicates the incident surface shape of the lens used in the light emitting device of Example 1.

FIG. 11A is a graph illustrating values (R) of an X-axis and a Y-axis; and sagAX and sagAY in the Table 1. FIG. 11B is a graph illustrating the values (R) of the X-axis and the Y-axis, and sagB.

Figure 12:
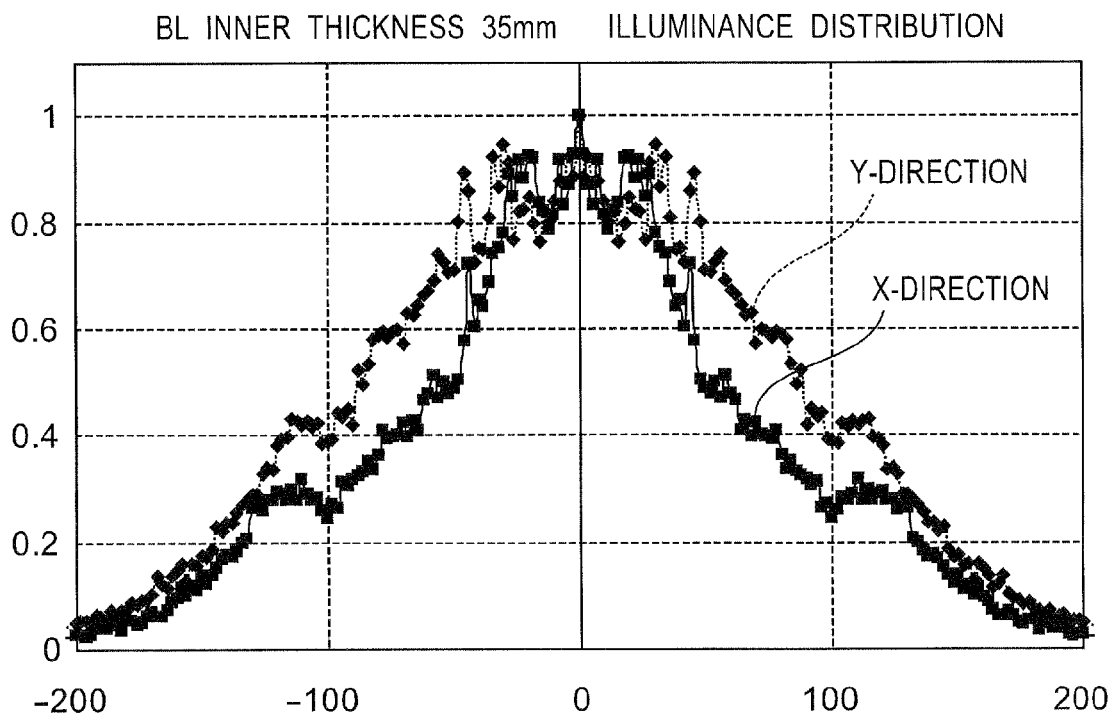
FIG. 12 is a graph illustrating an illuminance distribution of the light emitting device of Example 1.

FIG. 12 illustrates an illuminance distribution on the irradiated surface 4a of the diffuser plate 4 when the irradiated surface 4a is disposed at the position 35 mm away from light-emitting face 21 of the light source 2 in the optical axis direction using the light emitting device 1 of Example 1. In FIG. 12, a vertical axis indicates the illuminance normalized by the maximum value, and a horizontal axis indicates the distance (mm) from the optical axis.

Figure 13:
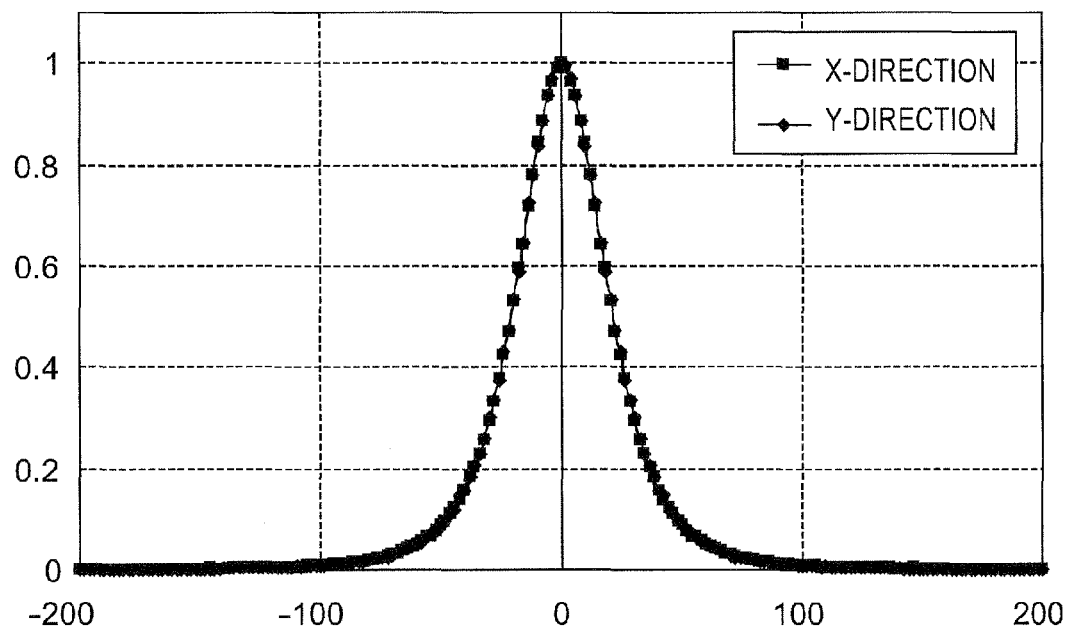
FIG. 13 is a graph illustrating an illuminance distribution when the surface light source is constructed just by LEDs in order to check an effect of the light emitting device of Example 1.

FIG. 13 illustrates an illuminance distribution when a surface light source is constructed only by the LED with no use of the lens 3 in order to check the effect of the light emitting device 1 of Example 1.

Figure 14:
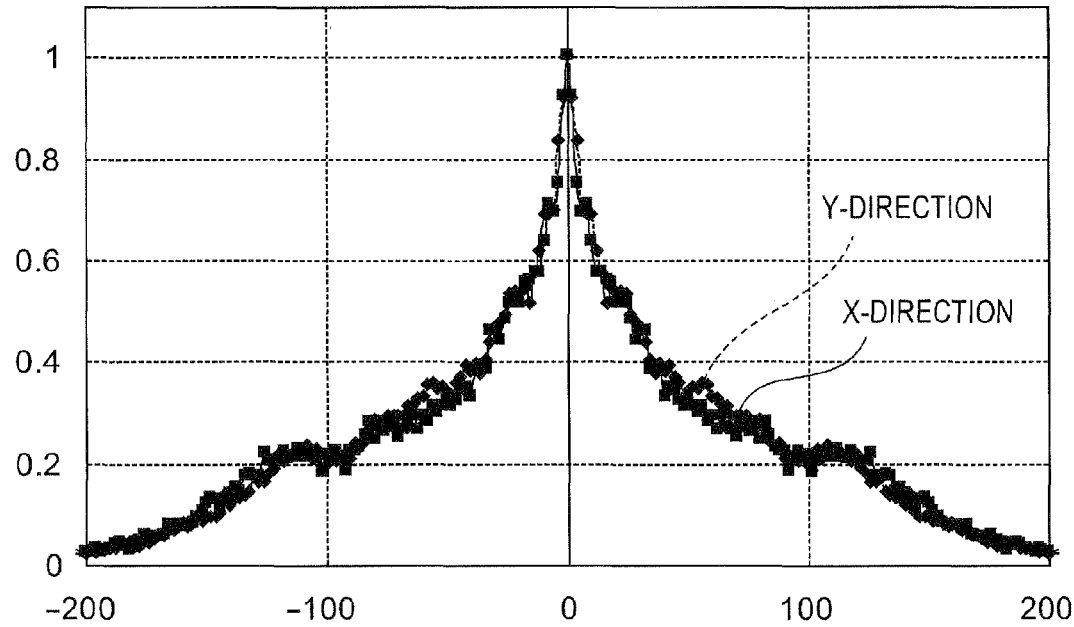
FIG. 14 is a graph illustrating an illuminance distribution when a reflection unit of the light emitting device of Example 1 is absent.

FIG. 14 illustrates an illuminance distribution on the irradiated surface 4a of the diffuser plate 4 when the reflection unit 34 of the lens 3 used in the light emitting device 1 of Example 1 is eliminated.

As illustrated in FIG. 14, the illuminance near the optical axis on the irradiated surface 4a can be suppressed by providing the reflection unit 34, and the light from the light source 2 can efficiently be expanded.

Figure 15:
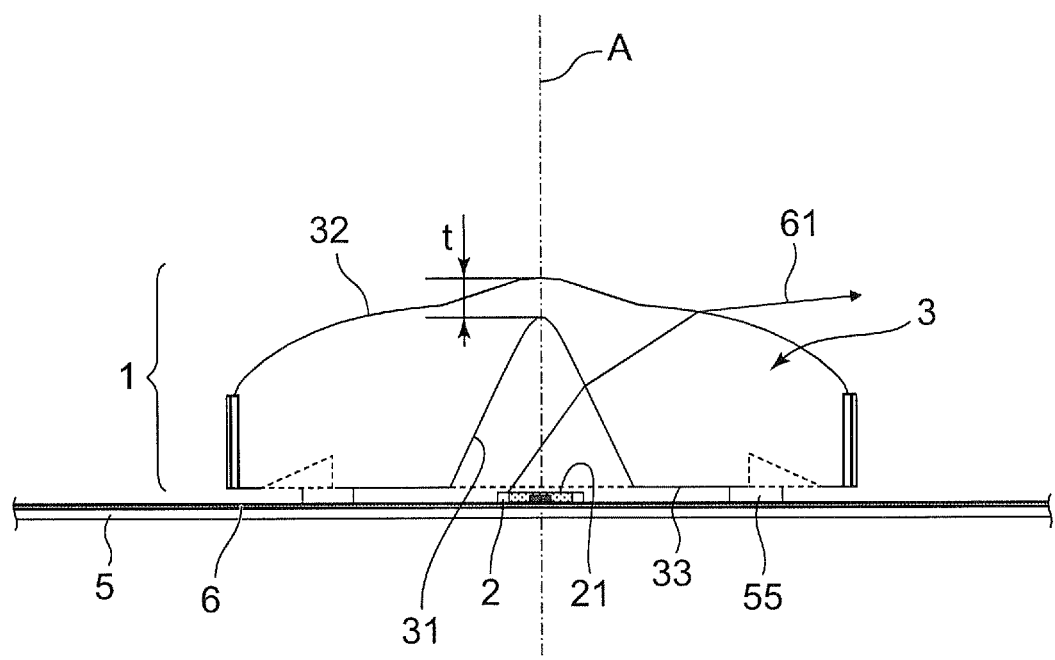
FIG. 15 is a light-path diagram of the light emitting device of Example 1.

FIG. 15 illustrates a light path 61 of a light beam, which is emitted from a neighborhood of the end surface of the light source 2 with a large angle with respect to the optical axis A and reaches the incident surface 31. The light emitted from the light source 2 is transmitted through the lens 3 while refracted by the incident surface 31, and then reaches the output surface 32. The light reached to the output surface 32 is transmitted through the output surface 32 while refracted by the output surface 32, and then reaches the irradiated surface 4a of the diffuser plate 4. In FIG. 15, assuming that D is a maximum width of the light-emitting face 21 of the light source 2 and that t is a center thickness of the lens 3, the following expression (1) may be satisfied. The maximum width D of the light-emitting face 21 is equivalent to a diameter in the case that the light-emitting face 21 has the circular shape when viewed from above, and the maximum width D is equivalent to a diagonal distance in the case that the light-emitting face 21 has the rectangular shape when viewed from above.

$$0.3 < D/t < 3.0 \qquad (1)$$

A component of the Fresnel reflection that varies by a change in size of the light source 2 decreases when the above condition is satisfied. On the other hand, the size (for example, a length in the optical axis direction) of the lens 3 increases when D/t is less than a lower limit of the expression (1), and the Fresnel reflection component is easily generated when D/t is greater than an upper limit of the expression (1).

Assuming that D is the maximum width of the light-emitting face 21 of the light source 2 and that De is an effective diameter of the lens 3, the following expression (2) may be satisfied.

$$0.03 < D/De < 0.3 \qquad (2)$$

The Fresnel reflection component that varies by the change in size of the light source 2 decreases when the above condition is satisfied. On the other hand, the size (for example, the length in the direction orthogonal to the optical axis) of the lens 3 increases when D/De is less than the lower limit of the expression (2), and the Fresnel reflection component is easily generated when D/De is greater than an upper limit of the expression (2).

In a case of the use of a lens in which the output surface 32 is the concave surface, the light emitted from the light source 2 is transmitted through the lens while refracted by the incident surface 31, and then reaches the output surface 32. The light reached to the output surface 32 partially generates the Fresnel reflection on the output surface 32, is refracted by the bottom surface 33 of the lens 3, and travels toward the board 5. The light is diffused and reflected by the board 5, refracted by the bottom surface 33 again, transmitted through the output surface 32 while refracted by the output surface 32, and reaches the irradiated surface 4a of the diffuser plate 4. In such shape in which the Fresnel reflection is easily generated, since an influence of the Fresnel reflection component changes depending on the change in size of the light source 2, the illuminance distribution largely changes on the irradiated surface 4a, thereby restricting the size of the light source 2.

On the other hand, since the Fresnel reflection is hardly generated in the lens 3 of the embodiments, the influence of the Fresnel reflection can be reduced, and the restrictions to the size and/or the shape of the light source 2 can be reduced.

Figure 16:
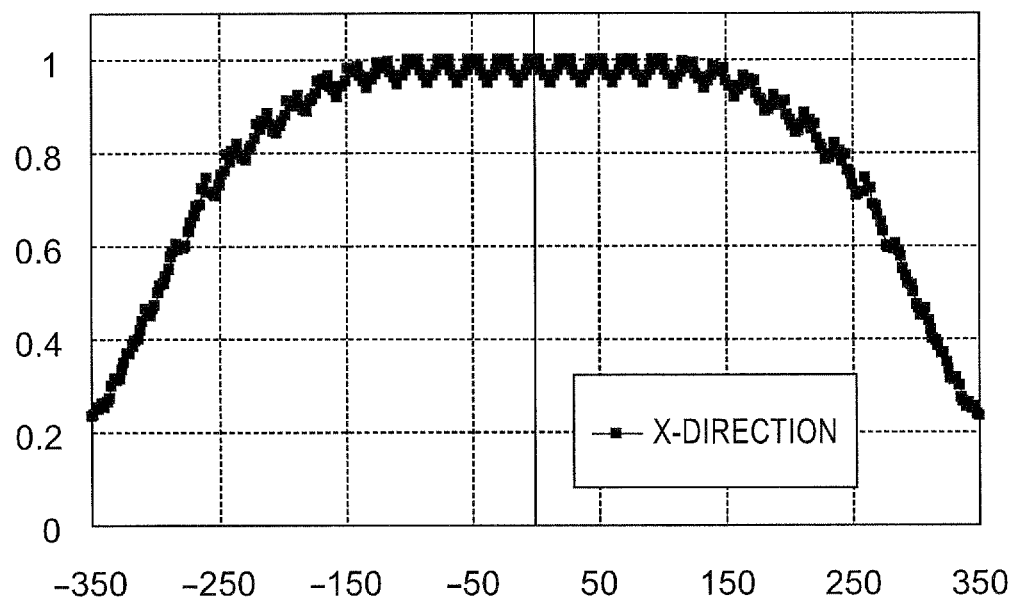
FIG. 16 shows graphs illustrating illuminance distributions of a surface light source of Example 1.
Figure 16:
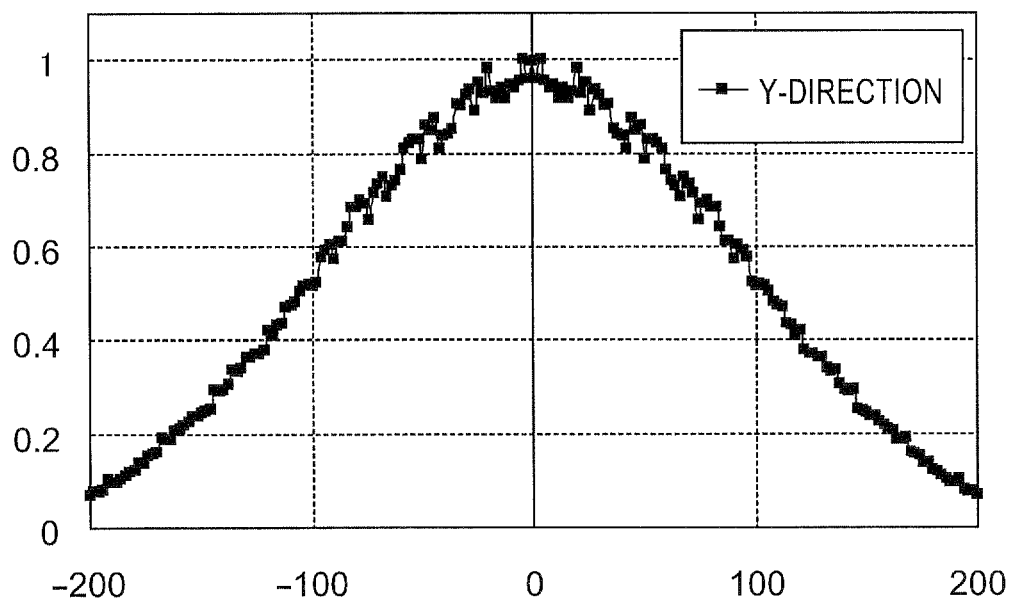

FIG. 16 illustrates an illuminance distribution on the irradiated surface 4a of the diffuser plate 4 when the 25 light emitting devices 1 of Example 1, in each of which the lens 3 in which the whole surface of the incident surface 31 is the anamorphic curved surface is used, are disposed in one line along the X-direction at a pitch of 24 mm while two of the light emitting devices 1 are disposed in the Y-direction and when the irradiated surface 4a of the diffuser plate 4 is disposed with 35 mm away from the light-emitting face 21 of the light source 2 in the optical axis direction.

Figure 17:
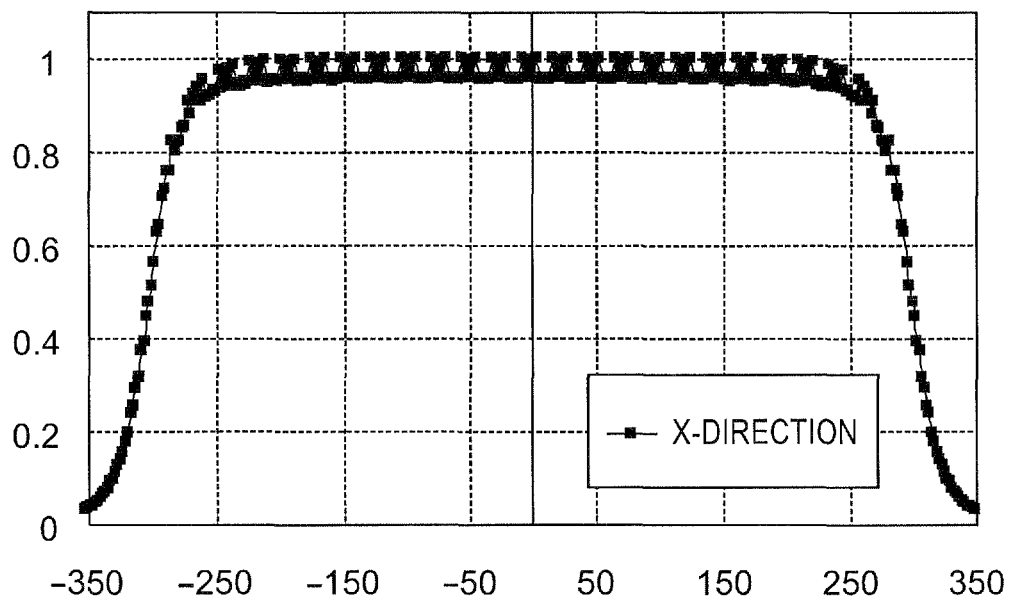
FIG. 17 shows graphs illustrating illuminance distributions of a light source only.
Figure 17:
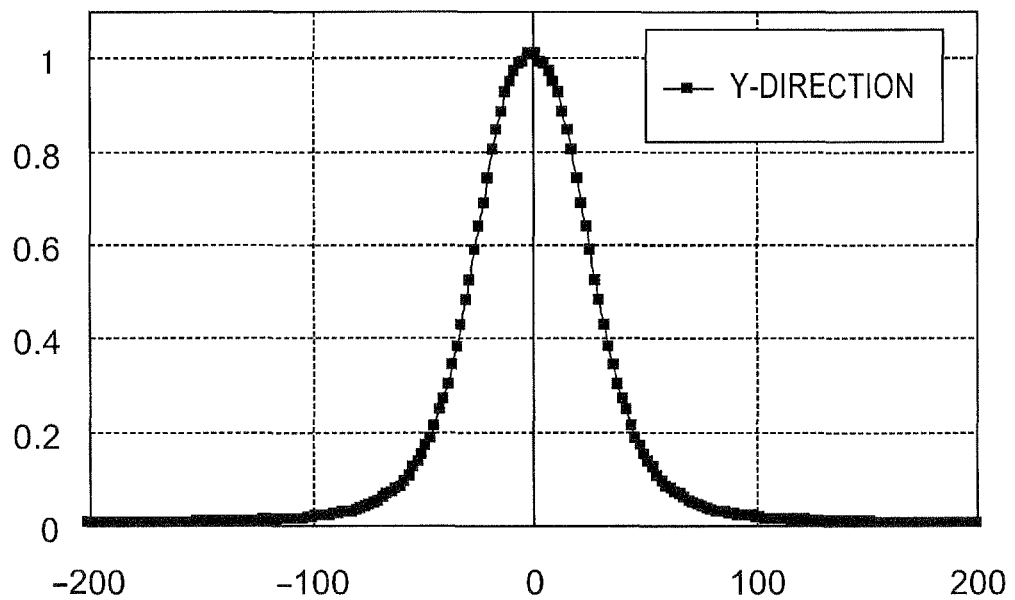

FIG. 17 illustrates an illuminance distribution on the irradiated surface 4a of the diffuser plate 4 when 25 LED light sources are disposed in one line along the X-direction at the pitch of 24 mm with no use of the lens 3 while two of the LED light sources are disposed in the Y-direction and when the irradiated surface 4a of the diffuser plate 4 is disposed with 35 mm away from the light-emitting face 21 of the light source 2 in the optical axis direction.

When the illuminance distribution in FIG. 16 is compared to that in FIG. 17, it is found that the illumination can evenly be performed on the irradiated surface 4a by the effect of the lens 3.

As above, the first to third embodiments are described as an example of the technology disclosed in the present patent application. However, the technology of the disclosure is not limited to the first to third embodiments. For example, the technology of the disclosure can also be applied to an embodiment in which a change, a replacement, an addition, an omission, and the like are properly performed.

It is to be noted that, by properly combining the arbitrary embodiments of the aforementioned various embodiments, the effects possessed by them can be produced.

Although the present disclosure has been fully described in connection with the embodiments thereof with reference to the accompanying drawings, it is to be noted that various changes and modifications are apparent to those skilled in the art. Such changes and/or modifications are to be understood as included within the scope of the present disclosure as defined by the appended claims unless they depart therefrom.

The components described in the accompanying drawings and the detailed description include not only components necessary for solving the problem but also components unnecessary for solving the problem for the purpose of the illustration of the technology. Therefore, it is to be noted that the fact that the component(s) unnecessary for solving the problem is described in the accompanying drawing(s) and the detailed description should not be immediately recognized that the component(s) unnecessary for solving the problem is the necessary component(s).

As described above, the present disclosure is useful to provide the surface light source having the sufficient brightness.

What is claimed is:

1. A surface light source comprising:
a light emitting device including a light source and a lens, the lens being configured to cover the light source and expand light from the light source; and
a diffuser plate configured to be disposed opposite to the light emitting device and be extended orthogonal to an optical axis of the light source,
wherein a plurality of the light emitting devices are configured to be disposed in line along one side of the diffuser plate and be opposite to a central portion of the diffuser plate,
the lens including: an incident surface configured to enter the light from the light source into the lens; an output surface configured to output the light incident to the lens from the lens; and a bottom surface configured to be located around the incident surface and located on an opposite side relative to the output surface, and
the bottom surface including a reflection unit having a concave shape along the optical axis at a flat area of the bottom surface.

2. The surface light source according to claim 1, wherein the reflection unit is disposed into a circular or elliptical shape about the optical axis.

3. The surface light source according to claim 2, wherein the reflection unit has a concave triangular shape.

4. The surface light source according to claim 1, wherein the reflection unit has a slope surface and an angle θ formed between the slope surface and the bottom surface, and the angle θ satisfies a conditional expression of 15°<θ<45°.

5. The surface light source according to claim 1, wherein at least one reflection unit is disposed on an outside position in which a distance from the optical axis to the reflection unit is greater than or equal to 65% of an effective diameter of the lens.

6. The surface light source according to claim 1, wherein the reflection units having different sizes are continuously and concentrically disposed about the optical axis on the bottom surface.

7. The surface light source according to claim 1, wherein the bottom surface including the reflection unit has a slope with increasing distance from the optical axis.

8. The surface light source according to claim 1, wherein a conditional expression of 0.03<D/De<0.3 is satisfied, where D is a maximum width of a light-emitting face of the light source and De is an effective diameter of the lens.

9. The surface light source according to claim 1, wherein a conditional expression of 0.3<D/t<3.0 is satisfied, where D is a maximum width of a light-emitting face of the light source and t is a center thickness of the lens.

10. The surface light source according to claim 1, further comprising:
a board configured to mount the light source of each of the plurality of light emitting devices and be disposed opposite to the diffuser plate; and
a reflecting member configured to cover the board while exposing the light source and be disposed between the board and the diffuser plate.

11. A liquid crystal display device comprising:
a liquid crystal display panel; and
a surface light source configured to be disposed on a back surface side of the liquid crystal display panel and have a size equivalent to the liquid crystal display panel,
the surface light source including: a light emitting device having a light source and a lens configured to be disposed while covering the light source and expand light from the light source; a diffuser plate configured to be disposed opposite to the light emitting device while being adjacent to the liquid crystal display panel and be extended while being orthogonal to an optical axis of the light source; a reflecting member configured to reflect the light output from the light emitting device toward the diffuser plate side; and a chassis configured to accommodate the light emitting device and the reflecting member and be closed by the diffuser plate while, further,
a plurality of the light emitting devices being disposed in line along one side of the diffuser plate while being opposite to a central portion of the diffuser plate,
the lens includes: an incident surface for entering the light from the light source;
an output surface for outputting the light entered into the lens; and a bottom surface located around the incident surface while being opposite to the output surface, and
the bottom surface including a reflection unit having a concave shape along the optical axis at a flat area of the bottom surface.

12. A surface light source comprising:
a light emitting device including a light source and a lens, the lens being configured to cover the light source and expand light from the light source; and
a diffuser plate configured to be disposed opposite to the light emitting device and be extended orthogonal to an optical axis of the light source,
wherein a plurality of the light emitting devices are configured to be disposed in line along one side of the diffuser plate and be opposite to a central portion of the diffuser plate,
the lens including: an incident surface configured to enter the light from the light source into the lens; an output surface configured to output the light incident to the lens from the lens; and a bottom surface configured to be located around the incident surface and located on an opposite side to the output surface,
wherein the bottom surface includes a reflection unit having a concave shape along the optical axis, and an acute angle is formed between the bottom surface and a surface of the reflection unit that opposes the output surface.

* * * * *